(12) United States Patent
Ahn et al.

(10) Patent No.: US 8,687,425 B2
(45) Date of Patent: Apr. 1, 2014

(54) NONVOLATILE MEMORY DEVICE, METHOD FOR OPERATING THE SAME, AND METHOD FOR FABRICATING THE SAME

(75) Inventors: Young-Soo Ahn, Gyeonggi-do (KR); Jong-Moo Choi, Gyeonggi-do (KR); Yoo-Hyun Noh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/610,810

(22) Filed: Sep. 11, 2012

(65) Prior Publication Data

US 2013/0170303 A1 Jul. 4, 2013

(30) Foreign Application Priority Data

Dec. 28, 2011 (KR) .................... 10-2011-0144934

(51) Int. Cl.
*G11C 11/34* (2006.01)
*G11C 16/04* (2006.01)
*G11C 5/02* (2006.01)
*G11C 5/06* (2006.01)

(52) U.S. Cl.
USPC .............. 365/185.17; 365/185.18; 365/51; 365/63

(58) Field of Classification Search
USPC .......... 365/185.17, 51, 63; 257/329, E29.262
See application file for complete search history.

(56) References Cited

U.S. PATENT DOCUMENTS

| 2011/0287597 | A1* | 11/2011 | Kito et al. | 438/261 |
| 2011/0298037 | A1* | 12/2011 | Choe et al. | 257/324 |
| 2012/0061741 | A1* | 3/2012 | Shim et al. | 257/314 |
| 2013/0009235 | A1* | 1/2013 | Yoo | 257/329 |
| 2013/0161724 | A1* | 6/2013 | Lee | 257/324 |
| 2013/0207178 | A1* | 8/2013 | Lee et al. | 257/324 |
| 2013/0207182 | A1* | 8/2013 | Lee et al. | 257/329 |

FOREIGN PATENT DOCUMENTS

| KR | 1020100053205 | 5/2010 |
| KR | 1020100069391 | 6/2010 |

* cited by examiner

*Primary Examiner* — Ly D Pham
(74) *Attorney, Agent, or Firm* — IP & T Group LLP

(57) ABSTRACT

A nonvolatile memory device includes a plurality of channel structures formed over a substrate and including a plurality of interlayer dielectric layers alternately stacked with a plurality of channel layers; first and second vertical gates alternately disposed between the channel structures along one direction crossing with the channel structure and adjoining the plurality of channel layers with a memory layer interposed therebetween; and a pair of first and second word lines disposed over or under the channel structures and extending along the one direction in such a way as to overlap with the first and second vertical gates. The first word line is connected with the first vertical gates and the second word line is connected with the second vertical gates.

14 Claims, 19 Drawing Sheets

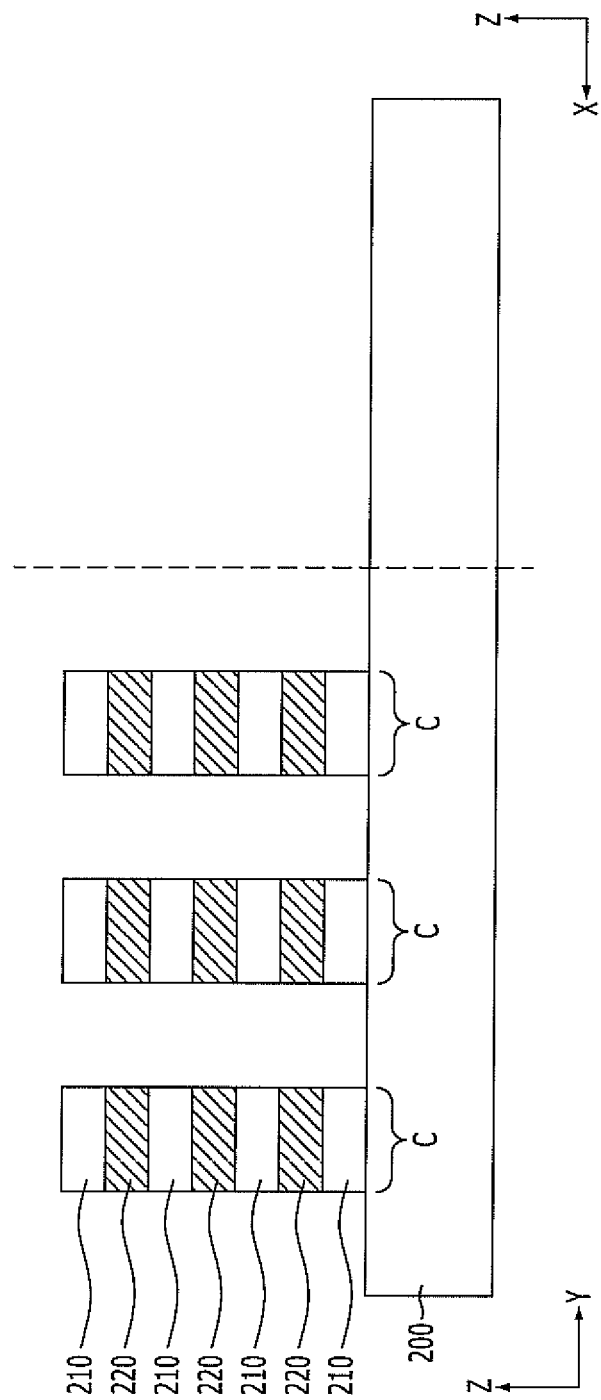

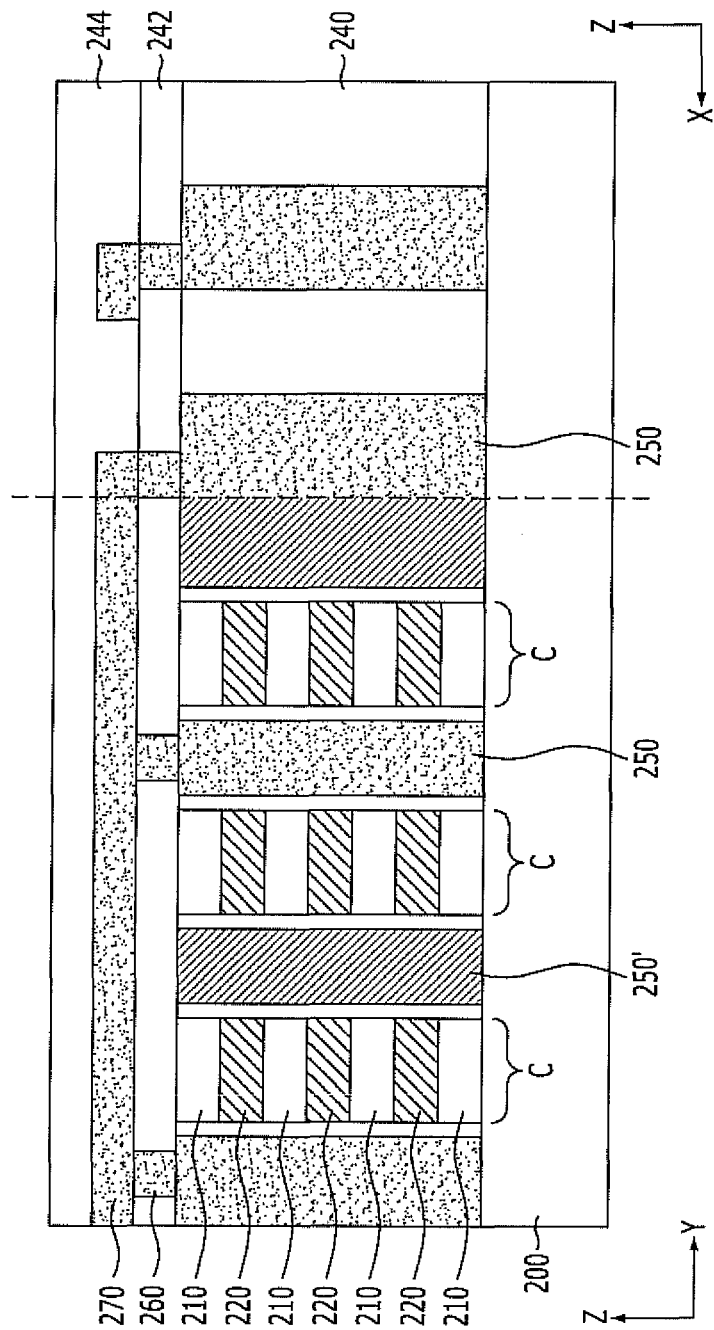

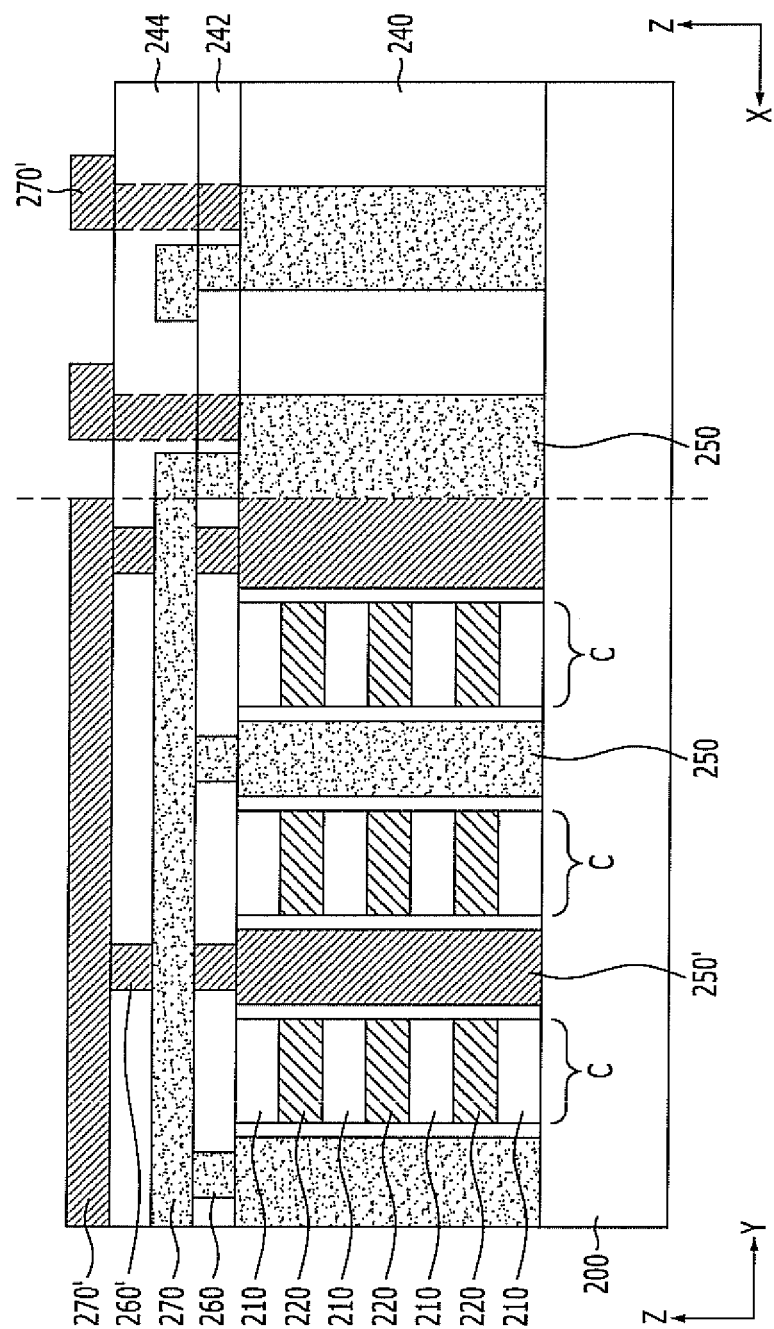

US 8,687,425 B2

NONVOLATILE MEMORY DEVICE, METHOD FOR OPERATING THE SAME, AND METHOD FOR FABRICATING THE SAME

CROSS-REFERENCE TO RELATED APPLICATIONS

The present application claims priority of Korean Patent Application No. 10-2011-0144934, filed on Dec. 28, 2011, which is incorporated herein by reference in its entirety.

BACKGROUND

1. Field

Exemplary embodiments of the present invention relate to a nonvolatile memory device, a method for operating the same and a method for fabricating the same, and more particularly, to a nonvolatile memory device including a plurality of memory cells vertically stacked on a substrate, a method for operating the same and a method for fabricating the same.

2. Description of the Related Art

A nonvolatile memory device is a memory device that maintains stored data as is even when power supply is interrupted. Currently, various nonvolatile memory devices such as a NAND type flash memory are widely used.

As a further increase in the integration degree of a two-dimensional nonvolatile memory device in which memory cells are formed in a single layer on a silicon substrate is reaching physical limits, a three-dimensional nonvolatile memory device in which a plurality of memory cells are vertically stacked from a silicon substrate have been developed.

FIGS. 1A to 1C are views illustrating a conventional three-dimensional nonvolatile memory device, wherein FIG. 1A is a perspective view, FIG. 1B is a cross-sectional view taken along the line A-A' of FIG. 1A, and FIG. 1C is a plan view mainly showing word lines in FIG. 1A.

Referring to FIGS. 1A to 1C, a conventional nonvolatile memory device includes a substrate 100, channel structures C disposed on the substrate 100 and extending in a first direction (see the x axis), word lines WL_0 to WL_N extending in a second direction (see the y axis) between the channel structures C to face the sidewalls of the channel structures C, a source select line SSL and a source line SL, drain select lines DSL_0 to DSL_N disposed over the step-shaped ends of the channel structures C and extending in the second direction, and bit lines BL disposed over the drain select lines DSL_0 to DSL_N and extending in the first direction. A memory layer 130 is interposed between the word lines WL_0 to WL_N and the channel structures C, and a gate dielectric layer 140 is interposed between the source select line SSL and the channel structures C. The memory layer 130 is a layer for electrically insulating channel layers 120 and the word lines WL from each other and storing charges, where the layer may have a three-layered structure including a tunnel dielectric layer, a charge storing layer and a charge blocking layer, for example, an ONO (oxide-nitride-oxide) structure.

In detail, the channel structures C include a plurality of interlayer dielectric layers 110 and a plurality of channel layers 120, which are alternately stacked. One word line WLm, which faces one channel layer 120, and the memory layer 130 interposed between the word line WLm and the channel layer 120 constitute a unit memory cell MC. Also, the source select line SSL, which faces one channel layer 120, and the gate dielectric layer 140 interposed between the source select line SSL and the gate dielectric layer 140 constitute a source select transistor.

Channel contacts 150 are formed on the protecting ends of the respective channel layers 120, and channels 160 of drain select transistors are disposed over the respective channel contacts 150. One drain select line DSL that faces one channel 160 and a gate dielectric layer (not shown) interposed therebetween constitute a drain select transistor.

A plurality of memory cells MC that share the same channel layer 120 constitute one string ST. Accordingly, in each channel structure C, strings ST_0~X that are stacked to have the same number as the number of the channel layers 120 are disposed. The stacked strings ST_0~X sharing the same channel structure C are connected to the same bit line BL. Further, a plurality of stacks of strings ST_0~X that are connected to a plurality of bit lines BL are commonly connected to one source line SL.

A plurality of memory cells MC which share the same word line WL constitute one page PAGE. Accordingly, for each word line WL, pages PAGE_0~X are stacked to have the same number as the number of the channel layers 120. A page PAGE desired among the stacked pages PAGE_0~X which share one word line WL may be selected by a drain select transistor.

The read and write operations of the nonvolatile memory device structured as described above may be performed, in particular, in such a way as to select desired pages PAGE using a plurality of drain select transistors while controlling the word lines WL_0 to WL_N and the bit lines BL according to a scheme generally known in the art. That is to say, in the read and write operations, desired pages PAGE may be selected by turning on drain select transistors which are connected to the desired pages PAGE and turning off the remaining drain select transistors.

However, in the above-described nonvolatile memory device, because the same word line WL faces both sidewalls of each channel layer 120, in a program or erase operation, charges are simultaneously inserted into or taken out of the charge storing layer of the memory layer 130 through both sides of a selected memory cell MC. In other words, one bit data ('00' or '11') is stored in one memory cell MC. FIG. 1C exemplifies that data of '00' is stored.

In addition, due to the structural characteristics of the above-described nonvolatile memory device, as the charge storing layer of the memory layer 130, a dielectric layer which stores charges in an energy trap, for example, a silicon nitride layer, is widely used. In this case, when compared to the charge storing layer of a floating gate type nonvolatile memory device, for example, a polysilicon layer, it is further difficult to realize a multi-level cell.

As a consequence, in the conventional three-dimensional nonvolatile memory device as described above, it is difficult to implement a multi-level cell.

SUMMARY

Embodiments of the present invention are directed to a nonvolatile memory device having a multi-level cell in a three-dimensional structure, and a method for fabricating the same.

In accordance with an embodiment of the present invention, a nonvolatile memory device includes: a plurality of channel structures formed over a substrate and including a plurality of interlayer dielectric layers alternately stacked with a plurality of channel layers; first and second vertical gates alternately disposed between the channel structures along one direction crossing with the channel structure and adjoining the plurality of channel layers with a memory layer interposed therebetween; and a pair of first and second word lines disposed over or under the channel structures and extending along the one direction in such a way as to overlap with the first and second vertical gates, wherein the first word line is connected with the first vertical gates and the second word line is connected with the second vertical gates.

In accordance with another embodiment of the present invention, a method for programming the nonvolatile memory device includes: performing a first program action of, in order to introduce charges into the memory layer which adjoins the first vertical gate of a first column on one side of a first channel layer among the plurality of channel layers, applying a program voltage to the first word line that overlaps with the first column and applying a turn-off voltage to the second word line that overlaps with the first column; and performing a second program action of, in order to introduce charges into the memory layer that adjoins the second vertical gate of the first column on the other side of the first channel layer, applying a program voltage to the second word line which overlaps with the first column and applying a turn-off voltage to the first word line that overlaps with the first column.

In accordance with yet another embodiment of the present invention, a method for reading the nonvolatile memory device includes: performing a first read action of, in order to read data stored in the memory layer which adjoins the first vertical gate of a first column on one side of a first channel layer among the plurality of channel layers, applying a read voltage to the first word line that overlaps with the first column and applying a turn-off voltage to the second word line that overlaps with the first column; and performing a second read action of, in order to read data stored in the memory layer that adjoins the second vertical gate of the first column on the other side of the first channel layer, applying a read voltage to the second word line that overlaps with the first column and applying a turn-off voltage to the first word line which overlaps with the first column.

BRIEF DESCRIPTION OF THE DRAWINGS

FIGS. 3A to 3F are views illustrating a method for fabricating the nonvolatile memory device in accordance with the first embodiment of the present invention.

DETAILED DESCRIPTION

Figure 1A:
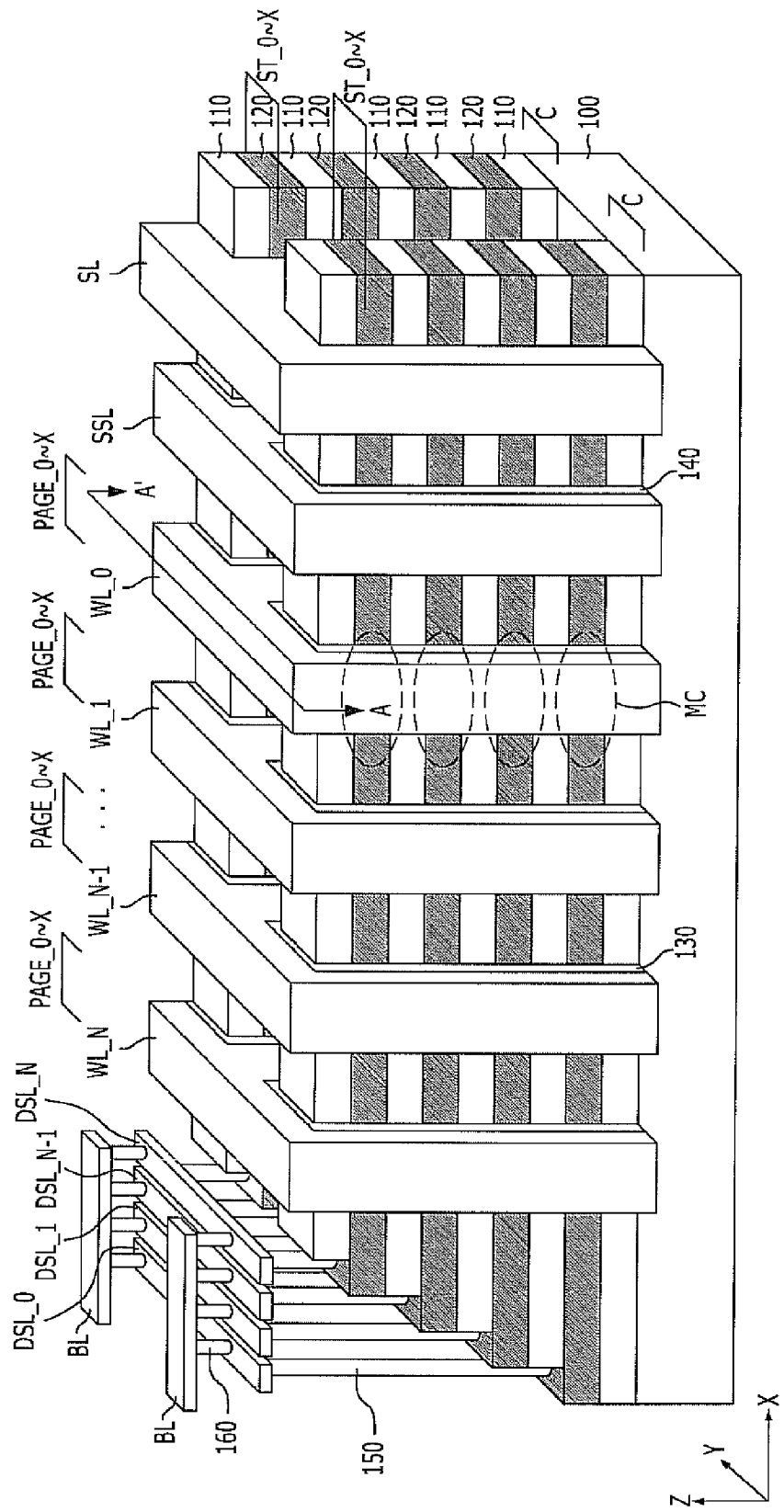
FIGS. 1A to 1C are views illustrating a conventional three-dimensional nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
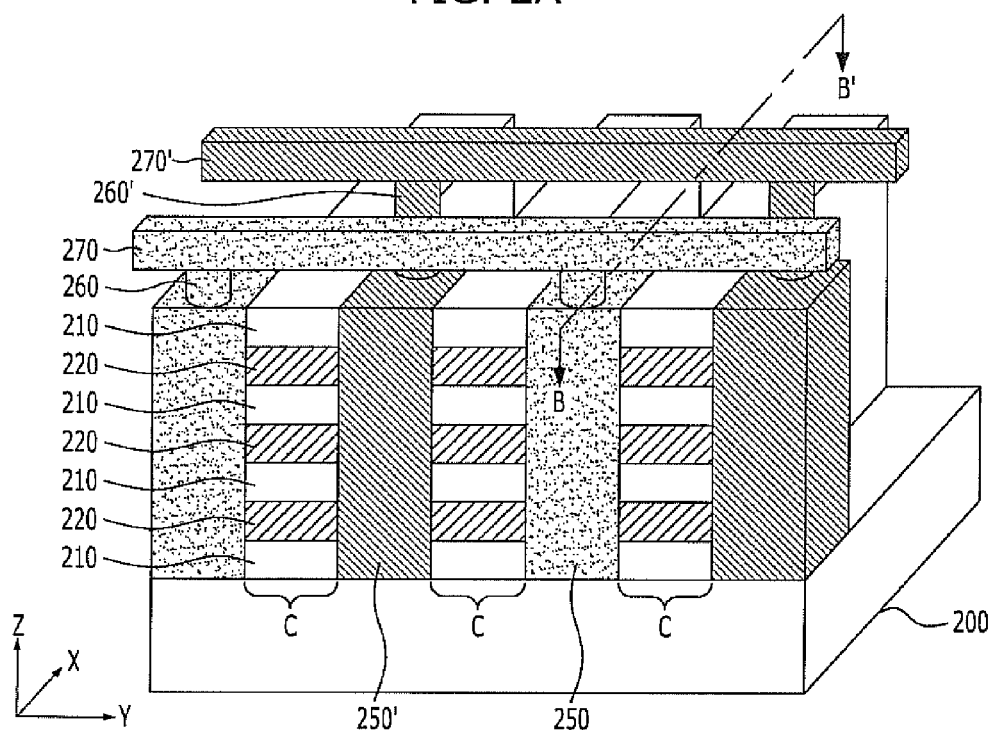
FIGS. 2A to 2D are views illustrating a nonvolatile memory device in accordance with a first embodiment of the present invention.
Figure 2B:
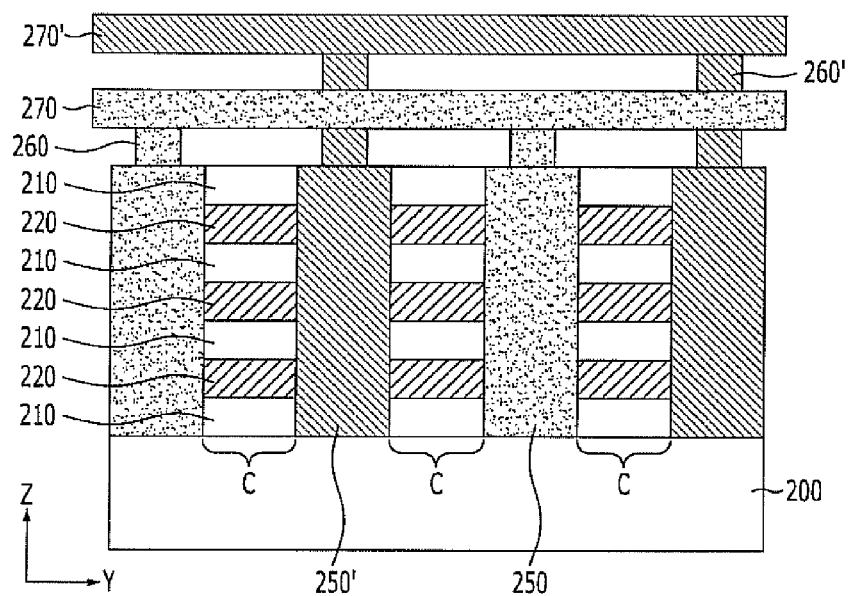
Figure 2C:
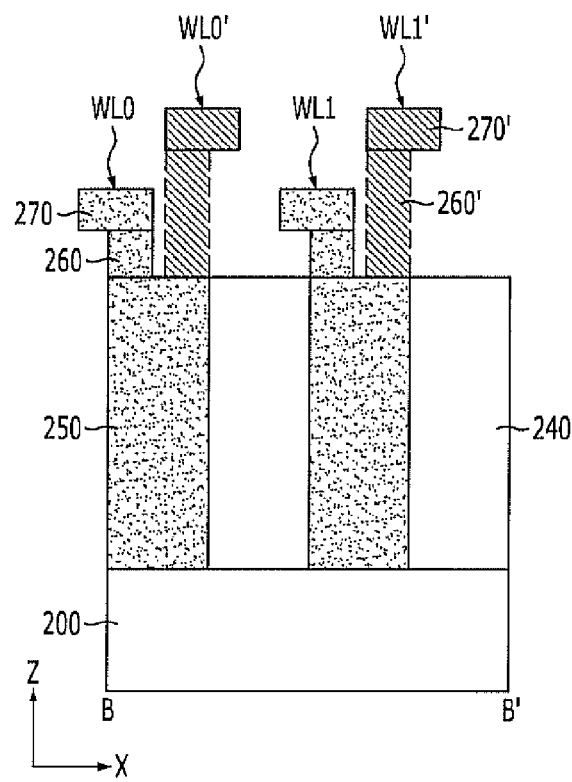
Figure 2D:
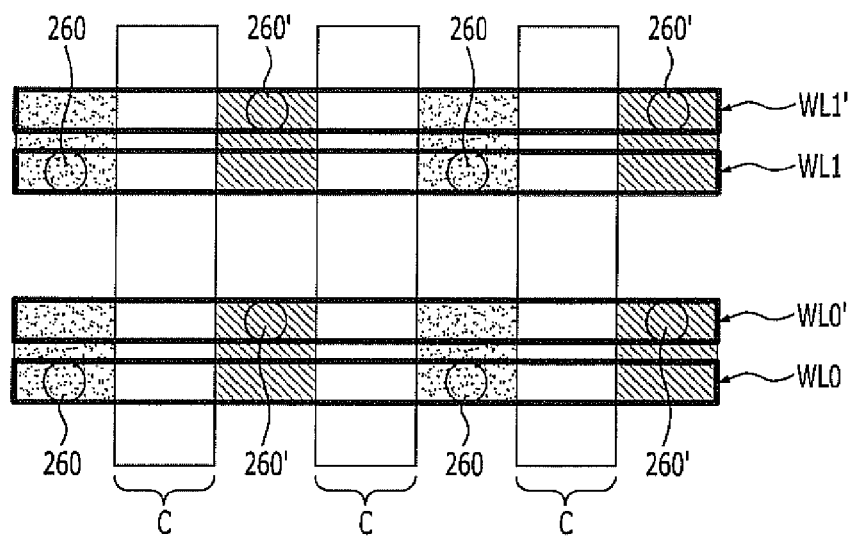

Hereinafter, description will be provided for a nonvolatile memory device in accordance with a first embodiment of the present invention with reference to FIGS. 2A to 2D. FIG. 2A is a perspective view of the nonvolatile memory device in accordance with the first embodiment of the present invention, FIG. 2B shows the y-z section of the FIG. 2A structure, FIG. 2C shows the x-z section of the FIG. 2A structure, in particular, taken along the line B-B' of the FIG. 2A structure, and FIG. 2D is a top view of the FIG. 2A structure. For illustration purposes, portions where word lines WL are disposed are mainly shown.

Referring to FIGS. 2A to 2D, the nonvolatile memory device in accordance with the first embodiment of the present invention includes a substrate 200, channel structures C which are disposed on the substrate 200 and extend in a first direction (see the x axis), vertical gates 250 and 250' which are disposed between the channel structures C and have pillar-like shapes projecting in a vertical direction (see the z axis) in such a way as to face the sidewalls of a plurality of channel layers 220, and word lines 270 and 270' which are connected with the vertical gates 250 and 250' over the channel structures C and extend in a second direction (see the y axis) crossing with the channel structures C. While not shown in the drawings, a memory layer is interposed between the sidewalls of the channel structures C and the vertical gates 250 and 250'. The memory layer includes a tunnel dielectric layer (for example, an oxide layer), a charge storing layer (for example, a nitride layer) and a charge blocking layer (for example, an oxide layer) which are disposed adjacent to the channel structures C in that order, respectively.

The substrate 200 may be a monocrystalline silicon substrate and may have a desired structure (not shown) including wells, a dielectric layer, etc.

The channel structures C include a plurality of interlayer dielectric layers 210 alternately stacked with a plurality of channel layers 220. The interlayer dielectric layers 210 may include an oxide layer or a nitride layer. The channel layers 220 may include a polysilicon layer doped with impurities or a monocrystalline silicon layer. A plurality of channel structures C may be spaced apart in parallel to one another.

The vertical gates 250 and 250' include first vertical gates 250 which overlap with a pair of word lines 270 and 270' and are connected with a first word line 270 of the pair of word lines 270 and 270' and second vertical gates 250' which overlap with the pair of word lines 270 and 270' and are connected with a second word line 270' of the pair of word lines 270 and 270'. Namely, the first and second vertical gates 250 and 250' are distinguished from each other depending on which of the pair of word lines 270 and 270' connected to the first and second vertical gates 250 and 250'. These first vertical gates 250 and second vertical gates 250' are alternately arranged in the second direction. Here, the first vertical gate 250 and the second vertical gate 250' are respectively disposed on both sides of each channel layer 220.

The pair of word lines 270 and 270' include the first word line 270 which extends in the second direction over the channel structures C and is connected with the first vertical gates 250 arranged in the second direction and the second word line 270' which is connected with the second vertical gates 250'. While only one pair of word lines 270 and 270' are shown in FIGS. 2A and 2B for illustration purposes, it is noted that a plurality of pairs of word lines 270 and 270' are arranged in parallel in the first direction. Two pairs of word lines 270 and 270' are exemplarily shown in FIGS. 2C and 2D. Here, a first pair of word lines 270 and 270' are designated by WL0 and WL0' and a second pair of word lines 270 and 270' are designated by WL1 and WL1'.

Since the first word line 270 is to be insulated from the second vertical gates 250' and the second word line 270' is to be insulated from the first vertical gates 250, gaps are present between the first word line 270 and the second vertical gates 250' and between the second word line 270' and the first vertical gates 250. To this end, the first word line 270 may be connected with the first vertical gates 250 through first contacts 260, and the second word line 270' may be connected with the second vertical gates 250' through second contacts 260'. However, it is to be appreciated that the present invention is not limited to such features. In another embodiment, by forming one or more (for example, the first vertical gates 250) of the first vertical gates 250 and the second vertical gates 250' to be higher than the others (for example, the second vertical gates 2501 the first vertical gates 250 and the first word line 270 may be directly connected with each other.

Furthermore, the first word line 270 and the second word line 270' may be placed at different heights. For example, as shown in the drawings, the second word line 270' may be placed higher than the first word line 270. This is because, if the first word line 270 and the second word line 270' are placed at the same height, a short circuit is likely to occur.

The reference numeral 240 of FIG. 2C designates a dielectric layer which fills the spaces between the first vertical gates 250 arranged in the first direction and the spaces between the second vertical gates 250' arranged in the first direction. Also, in FIG. 2C, the second contacts 260' are not present on the line B-B'. Thus, the second contacts 260' are not connected with the first vertical gates 250 and are connected with the second vertical gates 250' which are positioned on the same lines as the first vertical gates 250 in the second direction. Here, the second contacts 260' are shown by the dotted lines in FIG. 2C.

Figure 1B:
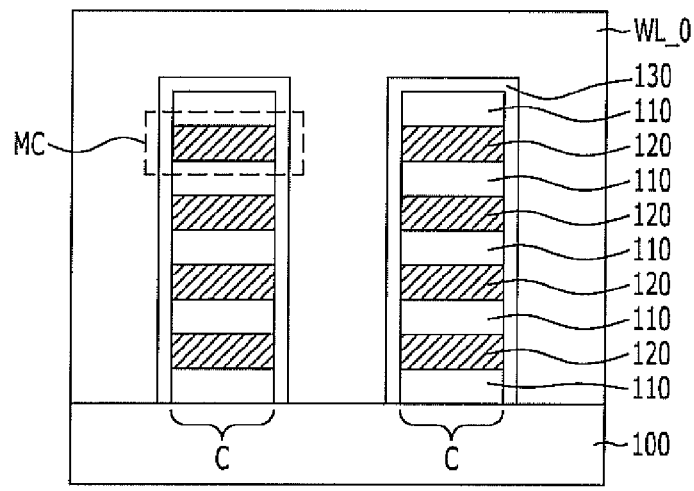
Figure 1C:
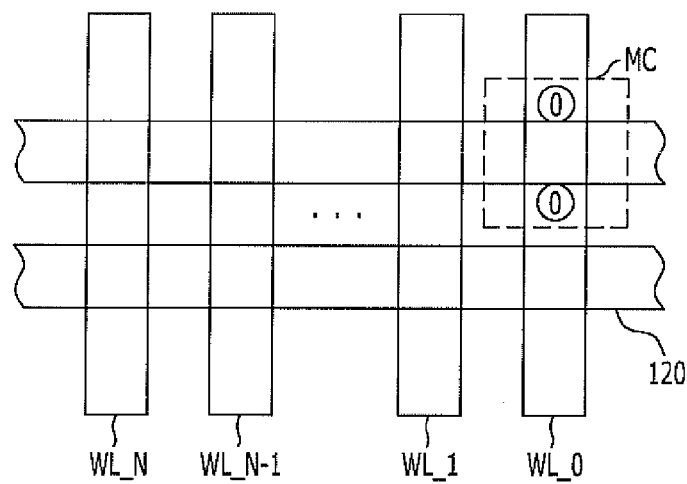

While not shown in the drawings, it is to be appreciated that a source select line and a source line generally known in the art are disposed on one side of the illustrated structure in the second direction and drain select lines and bit lines are disposed on the other side of the illustrated structure in the second direction (see FIG. 1).

In the nonvolatile memory device described above, the first and second gates 250 and 250' disposed on both sides of each channel layer 220 are respectively connected to the different word lines 270 and 270' and thus may be separately controlled. Accordingly, in a program operation, whether to insert charges into the charge storing layers of one side and the other side of each channel layer 220 may be separately determined. Further, in a read operation, the data stored in the charge storing layer of one side of each channel layer 220 and the data stored in the charge storing layer of the other side of each channel layer 220 may be separately read. Therefore, when assuming that one channel layer 220, the first and second vertical gates 250 and 250' on both sides of the channel layer 220 and the memory layer disposed therebetween constitute a unit memory cell, 2-bit data of '00', '01', '10' and '11' may be stored in the unit memory cell. Detailed program and read methods will be described later with reference to FIGS. 6A to 7D.

Hereinafter, a method for fabricating the nonvolatile memory device in accordance with the first embodiment of the present invention will be described with reference to FIGS. 3A to 3F. These drawings show the y-z section of the FIG. 2A structure and the x-z section of the FIG. 2A structure, in particular, taken along the line B-B' of FIG. 2A.

Referring to FIG. 3A, after alternately stacking a plurality of interlayer dielectric layers 210 and a plurality of channel layers 220 on a substrate 200, by selectively etching the stack structure, channel structures C are formed.

Figure 3B:
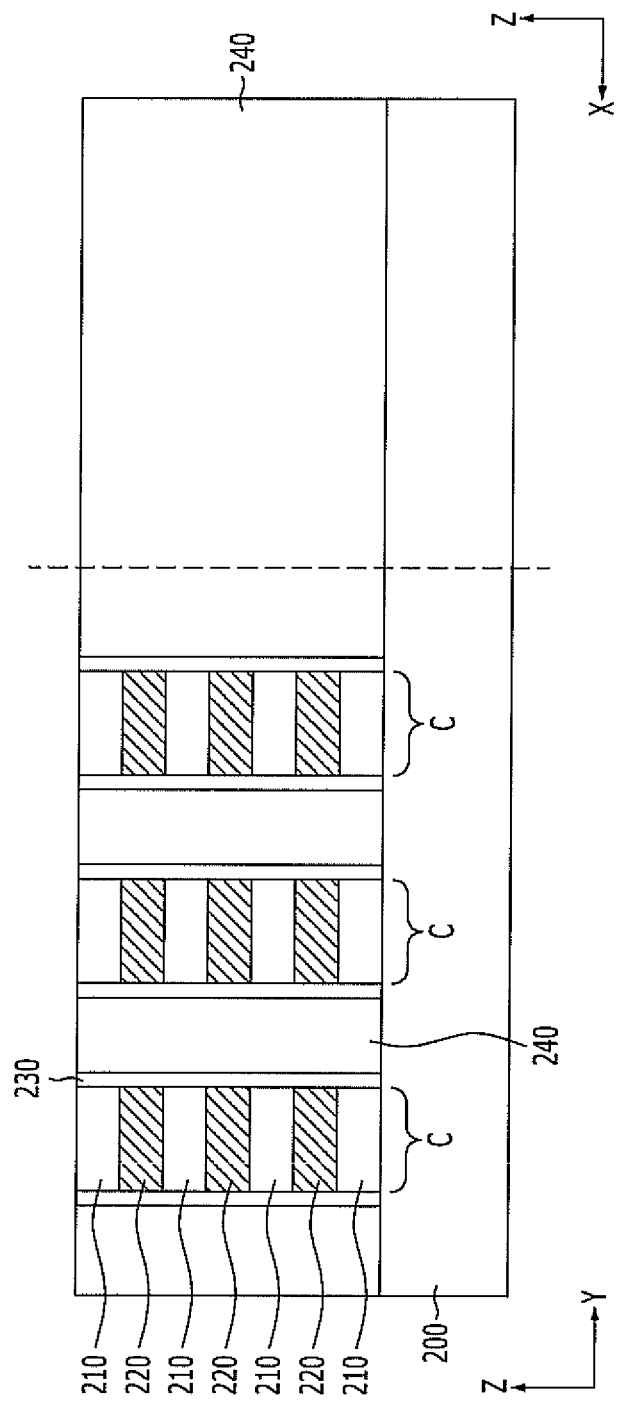

Referring to FIG. 3B, a memory layer 230 is formed on the entire surface of the channel structures C, and, after forming a first dielectric layer 240 to cover the entire resultant processed structure formed with the memory layer 230, a planarization process, for example, a CMP (chemical mechanical polishing) process is performed until the uppermost interlayer dielectric layer 210 is exposed. The memory layer 230 may be formed by sequentially depositing a tunnel dielectric layer (for example, an oxide layer), a charge storing layer (for example, a nitride layer) and a charge blocking layer (for example, an oxide layer).

As a result of this process, the memory layer 230 is formed on the sidewalls of the channel structures C, and the first dielectric layer 240 fills the spaces between the channel structures C formed with the memory layer 230. The first dielectric layer 240 may include an oxide layer.

Figure 3C:
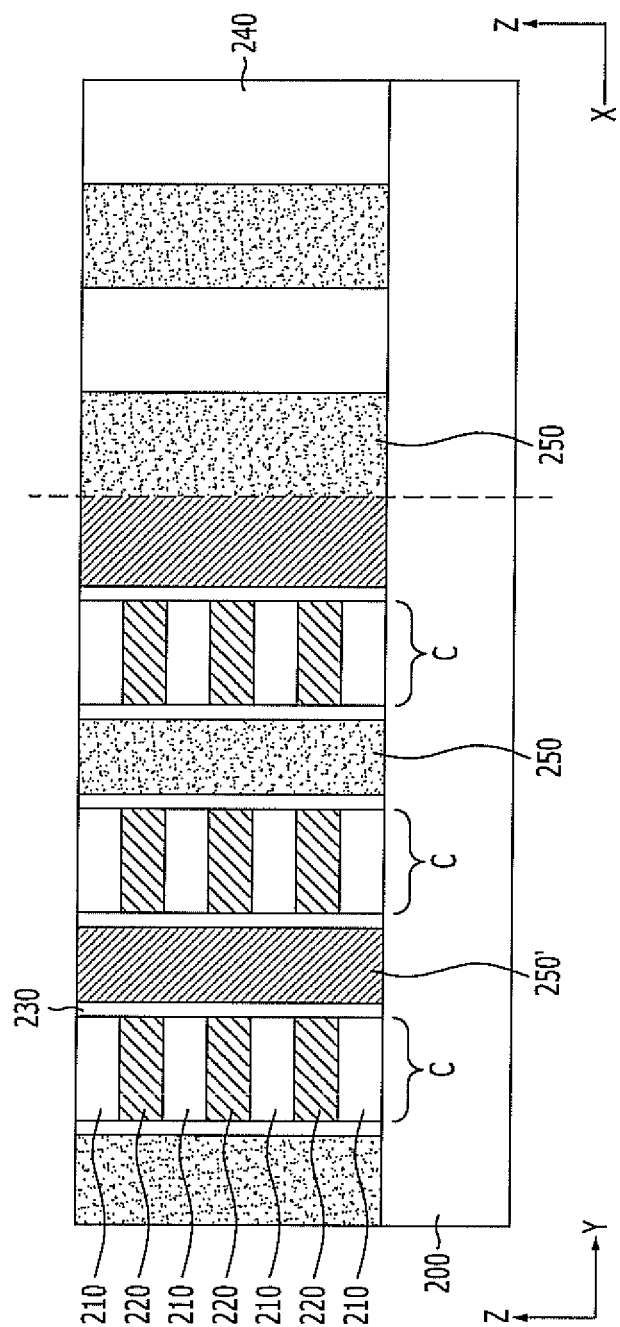

Referring to FIG. 3C, after forming a mask pattern (not shown) on the resultant processed structure of FIG. 3B in such a way as to expose regions where first and second vertical gates 250 and 250' are to be formed, by etching the exposed first dielectric layer 240 using the mask pattern as an etch barrier, trenches are formed to define the regions where the first and second vertical gates 250 and 250' are to be formed. The depth of the trenches is controlled such that the lower ends of the trenches are flush with or are positioned lower than the lower surface of the lowermost channel layer 220.

Subsequently, by filling a conductive substance, for example, a polysilicon layer doped with impurities, into the trenches, the first and second vertical gates 250 and 250' are formed. As described above, the first and second vertical gates 250 and 250' are distinguished by the word lines to which the first and second vertical gates 250 and 250' are connected, where the first and second word lines 250 and 250' may be formed of the same substance.

Figure 3D:
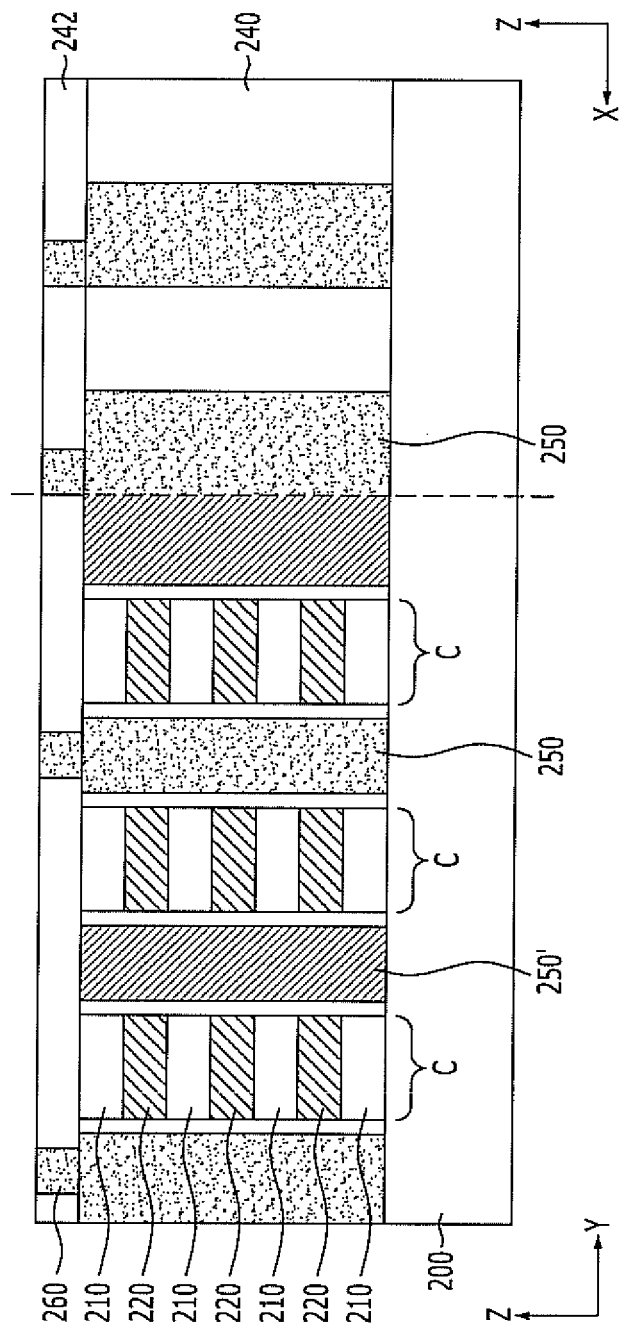

Referring to FIG. 3D, a second dielectric layer 242 is formed on the resultant processed structure of FIG. 3C. The second dielectric layer 242 may be, for example, an oxide layer.

Next, after selectively etching the second dielectric layer 242 and thereby defining contact holes which expose the first vertical gates 250, by filling a conductive substance in the contact holes, first contacts 260, which are respectively connected with the first vertical gates 250 through the second dielectric layer 242, are formed.

Referring to FIG. 3E, after depositing a conductive substance on the second dielectric layer 242 formed with the first contacts 260, by patterning the conductive substance, first word lines 270, which are connected with the first contacts 260 and extend in the second direction, are formed. However, instead of patterning the conductive substance, a damascene method may be adopted, in which a dielectric substance is deposited on the second dielectric layer 242, trenches where word lines are to be formed are defined by etching the dielectric substance and a conductive substance is filled in the trenches. When the damascene method is used, the first word lines 270 may be formed using a metal or a metal silicide, and accordingly, the resistance of the first word lines 270 may be reduced.

In succession, a third dielectric layer 244 is formed to cover the resultant structure formed with the first word lines 270.

Referring to FIG. 3F, after selectively etching the third dielectric layer 244 and the second dielectric layer 242 and thereby defining contact holes which expose the second vertical gates 250', by filling a conductive substance in the contact holes, second contacts 260', which are respectively connected with the second vertical gates 250' through the third dielectric layer 244 and the second dielectric layer 242, are formed. Since the second contacts 260' is to be electrically insulated from the already formed first word lines 270, their positions and the sizes is to be appropriately controlled. On x-z cross-section of the FIG. 3F structure, the second contacts 260' are not present on the line B-B'. Thus, the second contacts 260' are not connected with the first vertical gates 250 and are connected with the second vertical gates 250' which are positioned on the same lines as the first vertical gates 250 in the second direction. Here, the second contacts 260' are shown by the dotted lines in FIG. 3F.

Subsequently, after depositing a conductive substance on the third dielectric layer 244 formed with the second contacts 260', by patterning the conductive substance, second word lines 270', which are connected with the second contacts 260' and extend in the second direction, are formed. However, the formation of the second word lines 270' may be implemented through the above-described damascene process instead of patterning.

While substantially the same device as that shown in FIGS. 2A to 2D may be fabricated through the processes described above, the present invention is not limited to such features. It is to be noted that the device shown in FIGS. 2A to 2D may be fabricated through various processing steps.

Figure 4A:
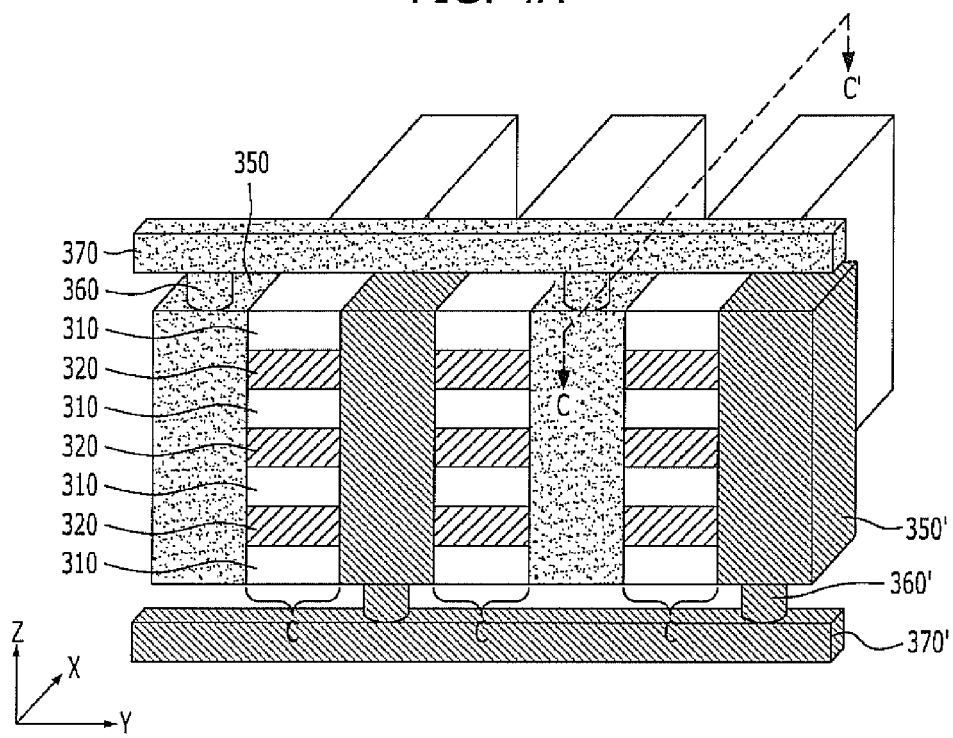
FIGS. 4A to 4D are views illustrating a nonvolatile memory device in accordance with a second embodiment of the present invention.
Figure 4B:
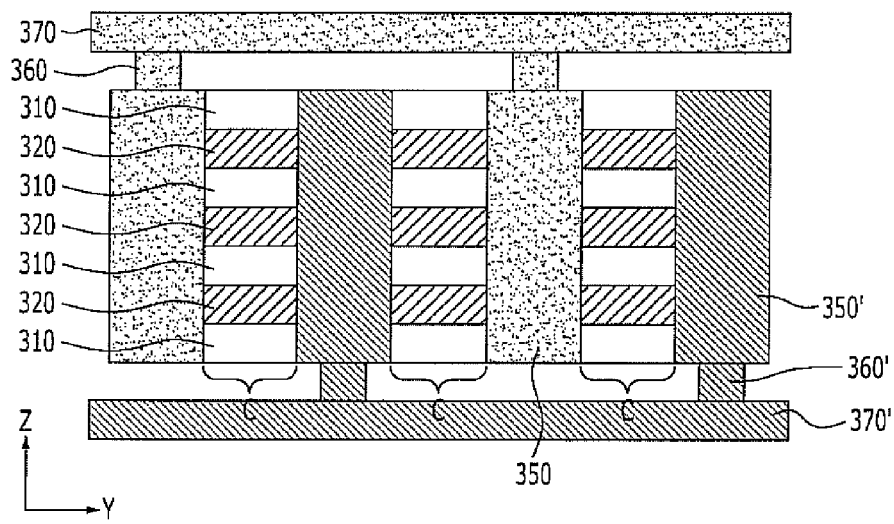
Figure 4C:
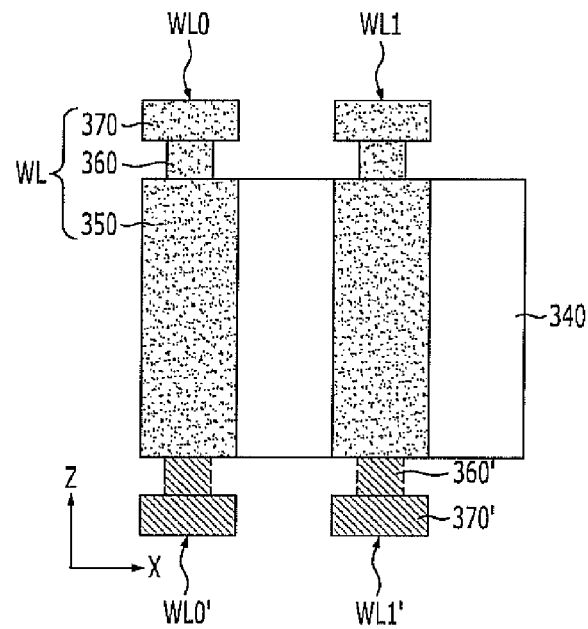
Figure 4D:
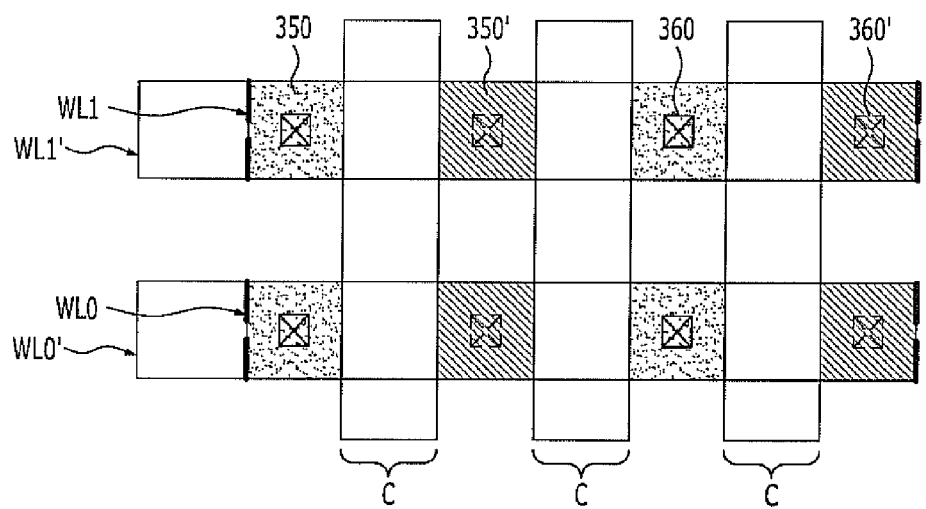

Hereinafter, a nonvolatile memory device in accordance with a second embodiment of the present invention will be described with reference to FIGS. 4A to 4D. FIG. 4A is a perspective view of the nonvolatile memory device in accordance with the second embodiment of the present invention, FIG. 4B shows the y-z section of the FIG. 4A structure, FIG. 4C shows the x-z section of the FIG. 4A structure, in particular, taken along the line C-C' of the FIG. 4A structure, and FIG. 4D is a top view of the FIG. 4A structure. Description for the same components as the first embodiment will be brief or omitted herein.

Referring to FIGS. 4A to 4D, the nonvolatile memory device in accordance with the second embodiment of the present invention includes a substrate (not shown), channel structures C which are disposed on the substrate and extend in a first direction (see the x axis), vertical gates 350 and 350' which are disposed between the channel structures C and face the sidewalls of a plurality of channel layers 220 of the channel structures C with a memory layer interposed therebetween, and word lines 370 and 370' which are connected with the vertical gates 350 and 350' over and under the channel structures C and extend in a second direction (see the y axis).

The vertical gates 350 and 350' include first vertical gates 350 which overlap with a pair of word lines 370 and 370' and are connected with a first word line 370 of the pair of word lines 370 and 370' and second vertical gates 350' which overlap with the pair of word lines 370 and 370' and are connected with a second word line 370' of the pair of word lines 370 and 370'.

The pair of word lines 370 and 370' include the first word line 370 which extends in the second direction over the channel structures C and is connected with the first vertical gates 350 arranged in the second direction and the second word line 370' which extends in the second direction under the channel structures C and is connected with the second vertical gates 350' arranged in the second direction. While only one pair of word lines 370 and 370' are shown in FIGS. 4A and 4B for illustration purposes, it is to be noted that a plurality of pairs of word lines 370 and 370' are arranged parallel to one another in the first direction. Two pairs of word lines 370 and 370' are exemplarily shown in FIGS. 4C and 4D. Here, a first pair of word lines 370 and 370' are designated by WL0 and WL0' and a second pair of word lines 370 and 370' are designated by WL1 and WL1'.

Since the first word line 370 is to be insulated from the second vertical gates 350' and the second word line 370' is to be insulated from the first vertical gates 350, gaps are present between the first word line 370 and the second vertical gates 350' and between the second word line 370' and the first vertical gates 350. To this end, the first word line 370 may be connected with the first vertical gates 350 through first contacts 360, and the second word line 370' may be connected with the second vertical gates 350' through second contacts 360'. However, it is to be appreciated that the present invention is not limited to such features. In another embodiment, by forming the first vertical gates 350 such that the upper surfaces of the first vertical gates 350 project beyond the upper surfaces of the second vertical gates 350', the first vertical gates 350 and the first word line 370 may be directly connected with each other, and, by forming the second vertical gates 350' such that the lower surfaces of the second vertical gates 350' project beyond the lower surfaces of the first vertical gates 350, the second vertical gates 350' and the second word line 370' may be directly connected with each other.

The reference numeral 340 of FIG. 4C designates a dielectric layer which fills the spaces between the first vertical gates 350 arranged in the first direction and the spaces between the second vertical gates 350' arranged in the first direction. Also, in FIG. 4C, the second contacts 360' are not present on the line C-C'. Thus, the second contacts 360' are not connected with the first vertical gates 350 but connected with the second vertical gates 350' which are positioned on the same lines as the first vertical gates 350 in the second direction. Here, the second contacts 360' are shown by the dotted lines in FIG. 4C.

As in the second embodiment, in the case where the first and second word lines 370 and 370' are separately positioned over and under the channel structures C, a short circuit between the first and second word lines 370 and 370' or between the first and second contacts 360 and 360' may be prevented. Therefore, since it is not necessary to precisely control the positions and sizes of the first and second word lines 370 and 370' and the first and second contacts 360 and 360', processes may be easily performed.

By projecting the ends of the second word lines 370' disposed under the channel structures C beyond the ends of the first word lines 370 (see FIG. 4D), the second word lines 370' may be connected with desired wiring lines in such a way as to form contacts on the projecting ends of the second word lines 370'.

In the nonvolatile memory device described above, similar to the first embodiment, the first and second gates 350 and 350' disposed on both sides of each channel layer 320 are respectively connected to the different word lines 370 and 370' and thus may be separately controlled. Therefore, similar to the first embodiment, 2-bit data may be stored. Detailed operations are also similar to those of the first embodiment and will be described later with reference to FIGS. 6A to 7D.

Hereinafter, a method for fabricating the nonvolatile memory device in accordance with the second embodiment of the present invention will be described with reference to FIGS. 5A to 5F. These drawings show the y-z section of the FIG. 4A structure as shown in FIG. 4B.

Figure 5A:
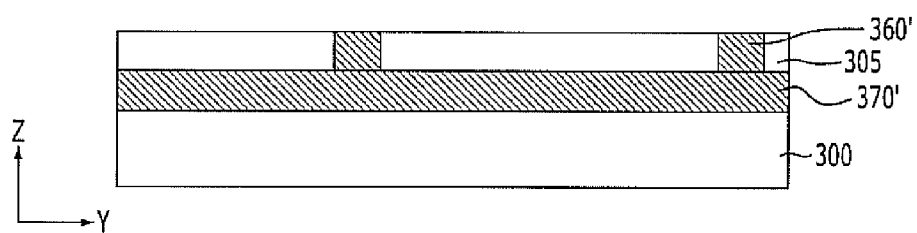
FIGS. 5A to 5F are views illustrating a method for fabricating the nonvolatile memory device in accordance with the second embodiment of the present invention.

Referring to FIG. 5A, after depositing a conductive substance on a substrate 300, by patterning the conductive substance, second word lines 370', which extend in the second direction, are formed. The formation of the second word lines 370' may be performed according to the above-described damascene method, and accordingly, the second word lines 370' may be formed using a metal or a metal silicide.

Subsequently, after forming a first dielectric layer 305 over the substrate 300 in such a way as to cover the second word lines 370', second contacts 360' are formed in such a way as to be connected with the second word lines 370' through the first dielectric layer 305. The second contacts 360' are formed to overlap with second vertical gates 350' which are subsequently formed as will be described later.

Figure 5B:
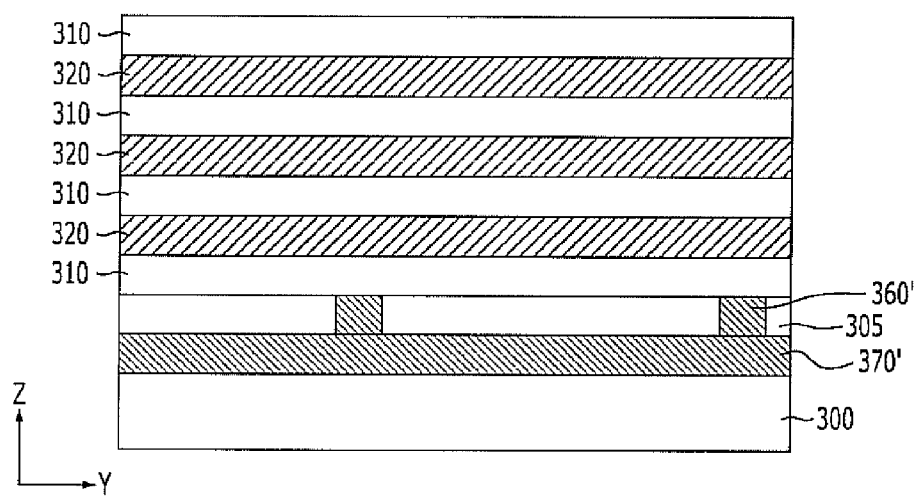

Referring to FIG. 5B, a plurality of interlayer dielectric layers 310 and a plurality of channel layers 320 are alternately stacked on the first dielectric layer 305 with the second contacts 360' formed therein.

Figure 5C:
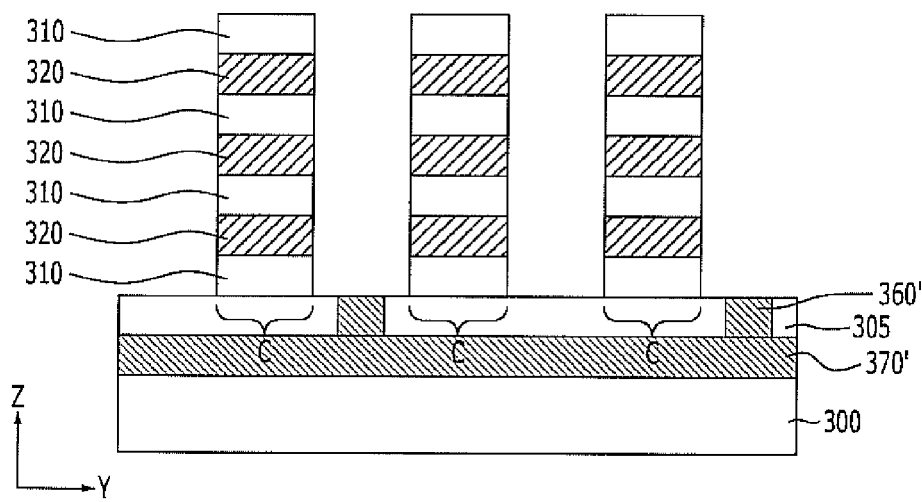

Referring to FIG. 5C, by selectively etching the plurality of interlayer dielectric layers 310 and the plurality of channel layers 320, channel structures C are formed.

Figure 5D:
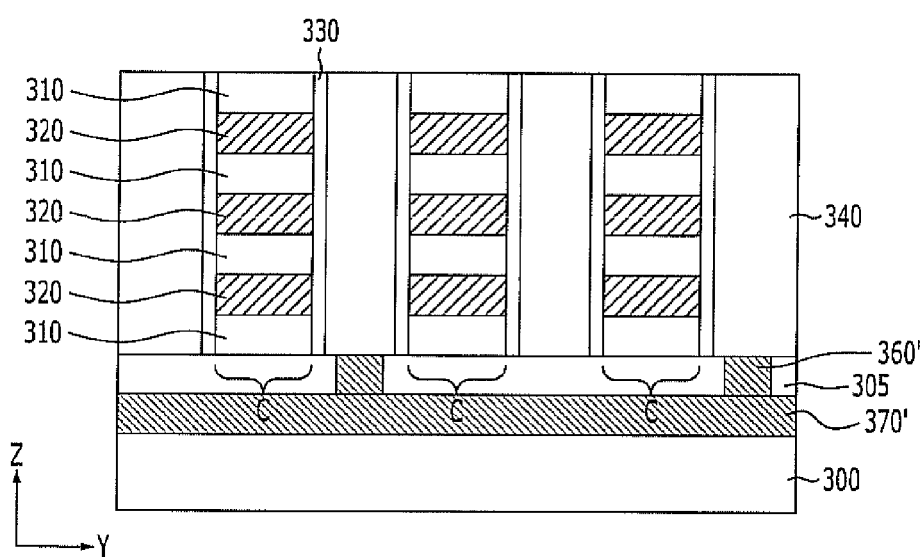

Referring to FIG. 5D, a memory layer 330 is formed on the entire surface of the channel structures C, and, after forming a second dielectric layer 340 to cover the entire resultant processed structure formed with the memory layer 330, a planarization process is performed until the uppermost interlayer dielectric layer 310 is exposed.

As a result of this process, the memory layer 330 is formed on the sidewalls of the channel structures C, and the second dielectric layer 340 fills the spaces between the channel structures C formed with the memory layer 330.

Figure 5E:
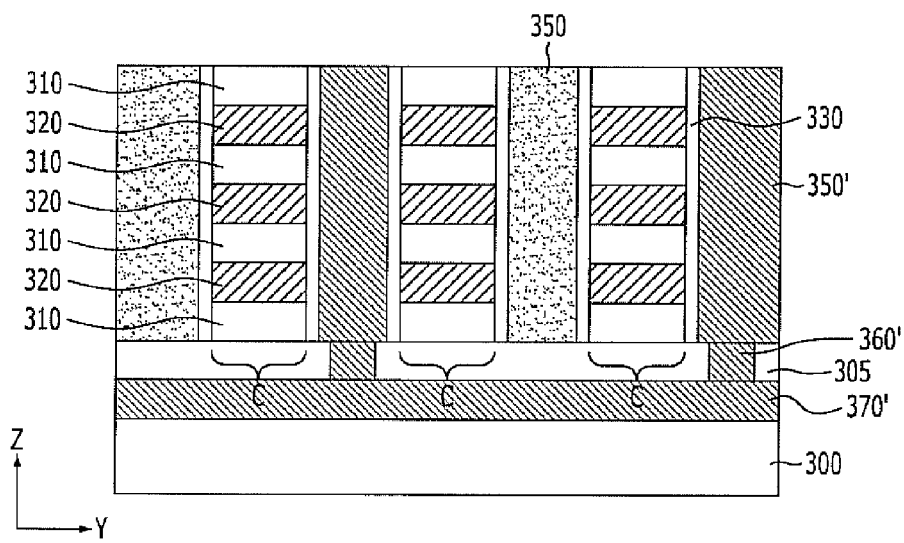

Referring to FIG. 5E, after forming a mask pattern (not shown) on the resultant processed structure of FIG. 5D in such a way as to expose regions where first and second vertical gates 350 and 350' are to be formed, by etching the exposed second dielectric layer 340 using the mask pattern as an etch barrier, trenches are formed to define the regions where the first and second vertical gates 350 and 350' are to be formed.

Subsequently, by filling a conductive substance in the trenches, the first and second vertical gates 350 and 350' are formed. As described above, the second vertical gates 350' are connected with the already formed second contacts 360'.

Figure 5F:
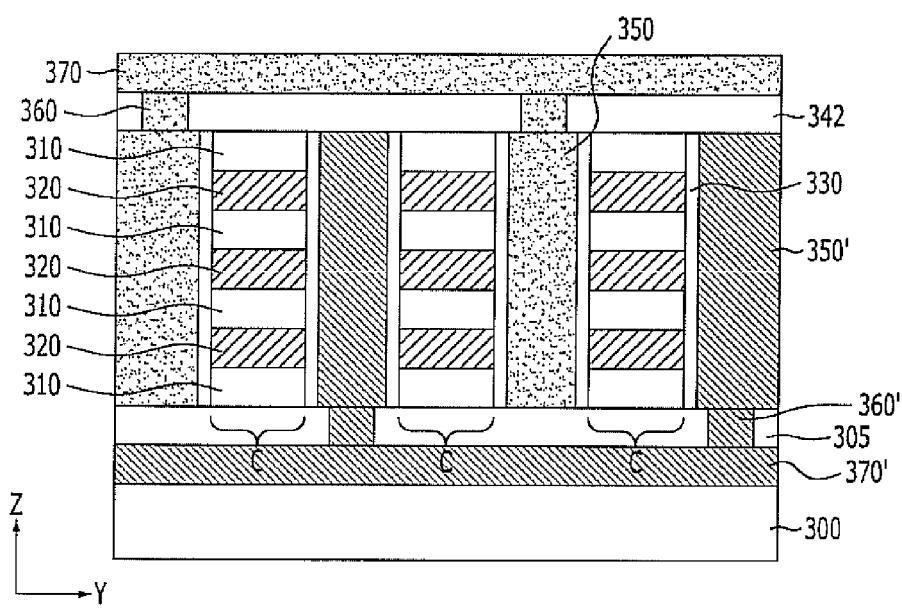

Referring to FIG. 5F, a third dielectric layer 342 is formed on the resultant processed structure of FIG. 5E.

In succession, after selectively etching the third dielectric layer 342 and defining contact holes in such a way as to expose the first vertical gates 350, by filling a conductive substance in the contact holes, first contacts 360, which are respectively connected with the first vertical gates 350 through the third dielectric layer 342, are formed.

Next, after depositing a conductive substance on the third dielectric layer 342 formed with the first contacts 360, by patterning the conductive substance, first word lines 370, which are connected with the first contacts 360 and extend in the second direction, are formed. The formation of the first word lines 370 may be performed according to the above-described damascene method, and accordingly, the first word lines 370 may be formed using a metal or a metal silicide.

While substantially the same device as that shown in FIGS. 4A to 4D may be fabricated through the processes described above, the present invention is not limited to such features. It is to be noted that the device shown in FIGS. 4A to 4D may be fabricated through different processing steps.

FIGS. 6A to 6D are views illustrating the program operations of a nonvolatile memory device in accordance with one embodiment of the present invention.

The nonvolatile memory device shown in FIGS. 6A to 6D is substantially the same as the nonvolatile memory device according to the first embodiment or the second embodiment. For illustration purposes, there are shown channel layers CH which are respectively provided to four channel structures extending in the first direction, three pairs of word lines WL0 and WL0', WL1 and WL1' and WL2 and WL2' which extend across the channel layers CH in the second direction, and first and second vertical gates VG1 and VG2 which overlap with the three pairs of word lines WL0 and WL0', WL1 and WL1' and WL2 and WL2' and are arranged in the second direction, in particular, alternately between the four channel layers CH. Among the three pairs of word lines WL0 and WL0', WL1 and WL1' and WL2 and WL2', first word lines WL0, WL1 and WL2 are connected with the first vertical gates VG1, and the second word lines WL0', WL1' and WL2' are connected with the second vertical gates VG2.

Figure 6A:
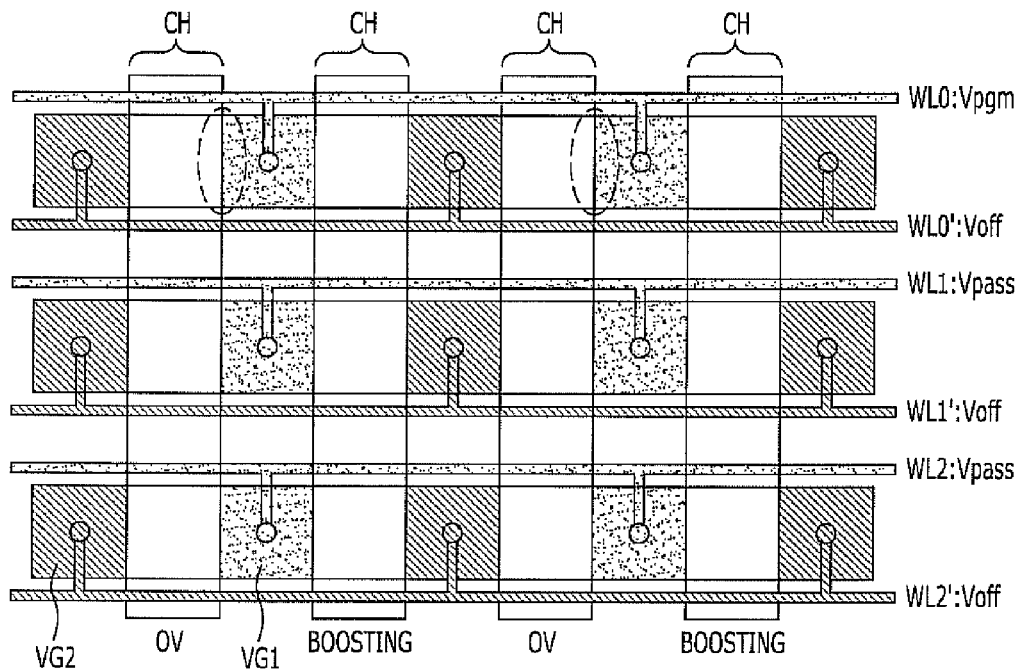
FIGS. 6A to 6D are views illustrating program operations of a nonvolatile memory device in accordance with one embodiment of the present invention.
Figure 6B:
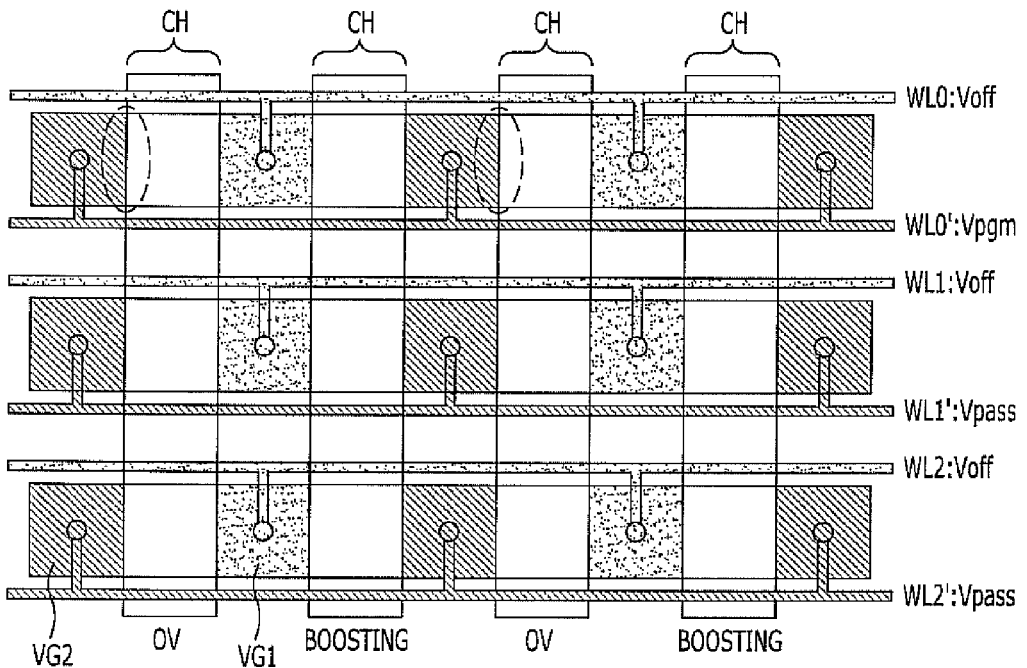

FIGS. 6A and 6B are to illustrate odd page program for programming memory cells which come into contact with odd-numbered channel layers CH. In particular, it was described above that programming may be separately performed on one side and the other side of each channel layer CH. FIG. 6A is a drawing for illustrating a program method for memory cells selected among memory cells which come into contact with the right sides of the odd-numbered channel layers CH, and FIG. 6B is a drawing for illustrating a program method for memory cells selected among memory cells which come into contact with the left sides of the odd-numbered channel layers CH. In the present embodiment, the selected memory cells are assumed to be memory cells which are connected to the first pair of word lines WL0 and WL0', and are shown by the dotted lines.

Referring to FIG. 6A, in order to perform odd page program, a bit line program voltage, for example, 0 V, is applied to the odd-numbered channel layers CH through bit lines (not shown) connected to the corresponding channel layers CH. Conversely, a bit line program prohibition voltage of a relatively high voltage, for example, a power supply voltage (Vcc), is applied to even-numbered channel layers CH through bit lines (not shown) connected to the corresponding channel layers CH, and connection to the bit lines is substantially blocked so that a potential may be boosted. At this time, while not shown in the drawing, connection between all channel layers CH and an unillustrated source line may be blocked.

Subsequently, in order to program the memory cells (see the dotted lines) which are selected while coming into contact with the right sides of the odd-numbered channel layers CH, a program voltage Vpgm of a relatively high positive voltage, for example, 20 V, is applied to the first word line WL0 of the first pair of word lines WL0 and WL0'. A pass voltage Vpass, for example, 10 V, is applied to the word lines WL1 and WL2 of the memory cells which come into contact with the right sides of the odd-numbered channel layers CH and are not selected, so that these unselected memory cells are turned on. Conversely, all memory cells which come into contact with the left sides of the odd-numbered channel layers CH may be turned off during this operation. To this end, a voltage Voff, for example, 0 V, is applied to the second word lines WL0', WL1' and WL2' to turn off the memory cells connected thereto.

In this case, electrons are introduced into the charge storing layer of the selected memory cells which come into contact with the right sides of the odd-numbered channel layers CH and are connected to the first word line WL0, by which program of the selected memory cells is performed.

Referring to FIG. 6B, in order to perform the odd page program, the bit line program voltage, for example, 0 V, is applied to the odd-numbered channel layers CH through the bit lines (not shown) connected to the corresponding channel layers CH. Conversely, the bit line program prohibition voltage of a relatively high voltage, for example, the power supply voltage (Vcc), is applied to the even-numbered channel layers CH through the bit lines (not shown) connected to the corresponding channel layers CH, and connection to the bit lines is substantially blocked so that a potential may be boosted. At this time, while not shown in the drawing, connection between all channel layers CH and an unillustrated source line may be blocked.

Subsequently, in order to program the memory cells (see the dotted lines) which are selected while coming into contact with the left sides of the odd-numbered channel layers CH, the program voltage Vpgm of a relatively high positive voltage, for example, 20 V, is applied to the second word line WL0' of the first pair of word lines WL0 and WL0'. The pass voltage Vpass, for example, 10 V, is applied to the word lines WL1' and WL2' of the memory cells which come into contact with the left sides of the odd-numbered channel layers CH and are not selected, so that these unselected memory cells are turned on. Conversely, all memory cells which come into contact with the right sides of the odd-numbered channel layers CH may be turned off during this operation. To this end, the voltage Voff, for example, 0 V, is applied to the first word lines WL0, WL1 and WL2 to turn off the memory cells connected thereto.

In this case, electrons are introduced into the charge storing layer of the selected memory cells which come into contact with the left sides of the odd-numbered channel layers CH and are connected to the second word line WL0', by which program of the selected memory cells is performed.

Figure 6C:
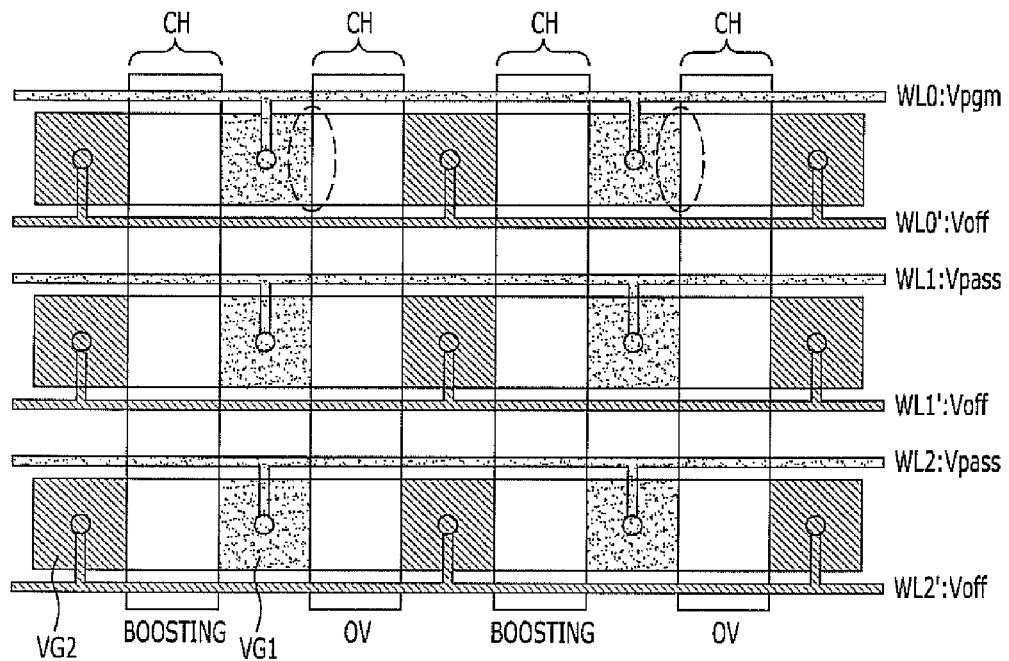
Figure 6D:
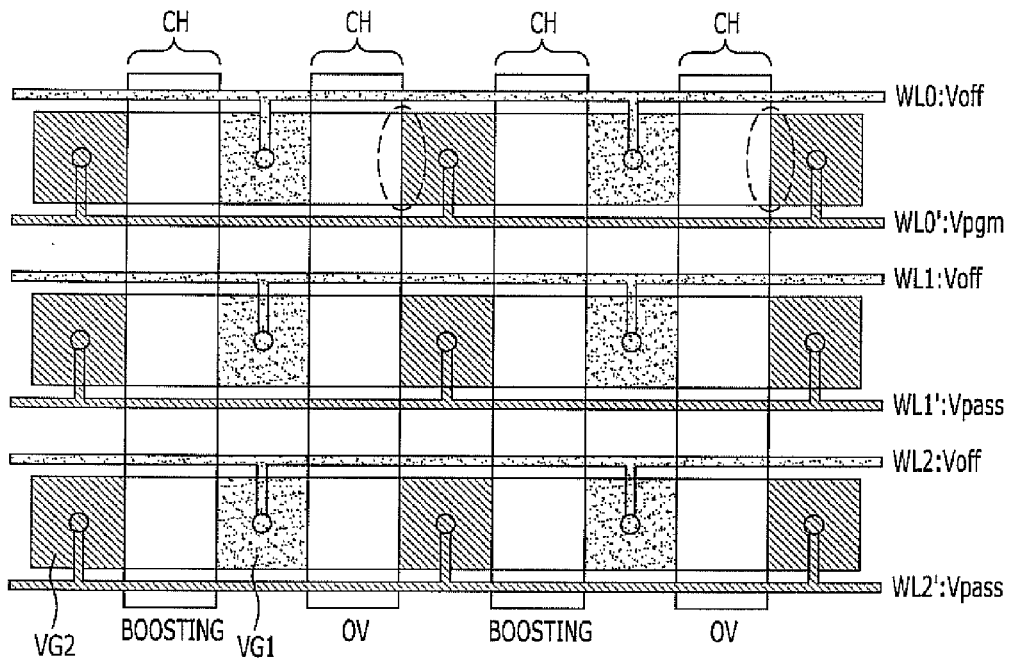

FIGS. 6C and 6D are to illustrate an even page program for programming memory cells which come into contact with odd-numbered channel layers CH. In particular, FIG. 6C is a drawing for illustrating a program method for memory cells selected among memory cells which come into contact with the left sides of the even-numbered channel layers CH, and FIG. 6D is a drawing for illustrating a program method for memory cells selected among memory cells which come into contact with the right sides of the even-numbered channel layers CH. In the present embodiment, the selected memory cells are assumed to be memory cells which are connected to the first pair of word lines WL0 and WL0', and are shown by the dotted lines.

Referring to FIG. 6C, in order to perform even page program, a bit line program voltage, for example, 0 V, is applied to the even-numbered channel layers CH through bit lines (not shown) connected to the corresponding channel layers CH. Conversely, a bit line program prohibition voltage of a relatively high voltage, for example, a power supply voltage (Vcc), is applied to odd-numbered channel layers CH through bit lines (not shown) connected to the corresponding channel layers CH, and connection to the bit lines is substantially blocked so that a potential may be boosted. At this time, while not shown in the drawing, connection between all channel layers CH and an unillustrated source line may be blocked.

Subsequently, in order to program the memory cells (see the dotted lines) which are selected while coming into contact with the left sides of the even-numbered channel layers CH, a program voltage Vpgm of a relatively high positive voltage, for example, 20 V, is applied to the first word line WL0 of the first pair of word lines WL0 and WL0'. A pass voltage Vpass is applied to the word lines WL1 and WL2 of the memory cells which come into contact with the left sides of the even-numbered channel layers CH and are not selected. Conversely, all memory cells which come into contact with the right sides of the even-numbered channel layers CH may be turned off during this operation. To this end, a turn-off voltage Voff is applied to the second word lines WL0', WL1' and WL2'.

In this case, electrons are introduced into the charge storing layer of the selected memory cells which come into contact with the left sides of the even-numbered channel layers CH and are connected to the first word line WL0, by which program of the selected memory cells is performed.

Referring to FIG. 6D, in order to perform the even page program, the bit line program voltage, for example, 0 V, is applied to the even-numbered channel layers CH through the bit lines (not shown) connected to the corresponding channel layers CH. Conversely, the bit line program prohibition voltage of a relatively high voltage, for example, the power supply voltage (Vcc), is applied to the odd-numbered channel layers CH through the bit lines (not shown) connected to the corresponding channel layers CH, and connection to the bit lines is substantially blocked so that a potential may be boosted. At this time, while not shown in the drawing, connection between all channel layers CFI and an unillustrated source line may be blocked.

Subsequently, in order to program the memory cells (see the dotted lines) which are selected while coming into contact with the right sides of the even-numbered channel layers CH, the program voltage Vpgm is applied to the second word line WL0' of the first pair of word lines WL0 and WL0'. The pass voltage Vpass is applied to the word lines WL1' and WL2' of the memory cells which come into contact with the right sides of the even-numbered channel layers CH and are not selected. Conversely, all memory cells which come into contact with the left sides of the even-numbered channel layers CH may be turned off during this operation. To this end, the turn-off voltage Voff is applied to the first word lines WL0, WL1 and WL2.

In this case, electrons are introduced into the charge storing layer of the selected memory cells which come into contact with the right sides of the even-numbered channel layers CH and are connected to the second word line WL0', by which program of the selected memory cells is performed.

As a consequence, referring to FIGS. 6A to 6D, program of memory cells on one side of each channel layer CH and program of memory cells on the other side of the channel layer CH may be completely separately performed. That is to say, data of '0' and '1' may be separately inputted to one side and the other side of one channel layer CH. Therefore, unlike the conventional art, 2-bit data may be stored in a memory cell which comes into contact with one channel layer CH.

In the present embodiment, while the even page program and the odd page program are separately performed, it is to be noted that the present invention is not limited to such features. As described above, program may be performed by controlling the voltages applied to word lines. In this regard, the channel layers CH connected to bit lines as program inhibition targets are caused to be in a boosted state, and the channel layers CH connected to bit lines as program targets are caused to become a low potential such as 0 V.

FIGS. 7A to 7D are views illustrating read operations of the nonvolatile memory device in accordance with one embodiment of the present invention.

Figure 7A:
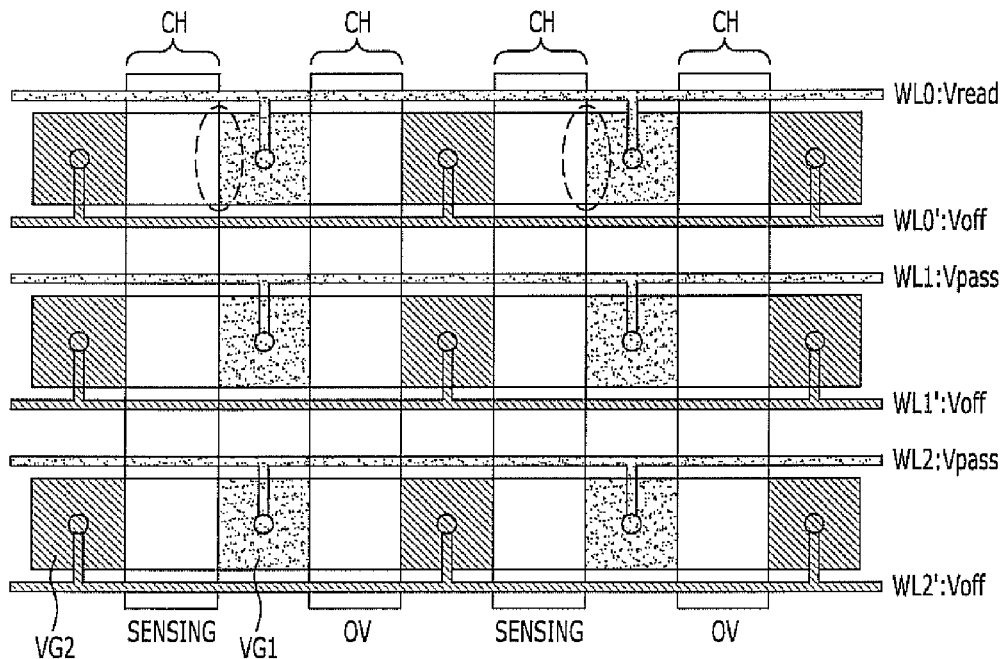
FIGS. 7A to 7D are views illustrating read operations of the nonvolatile memory device in accordance with one embodiment of the present invention.
Figure 7B:
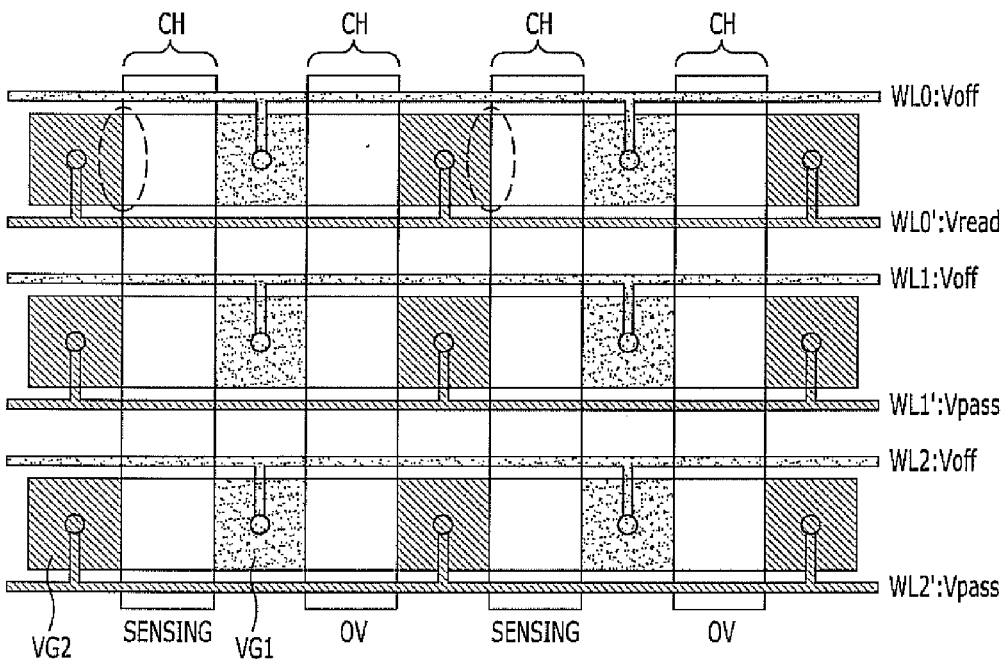

FIGS. 7A and 7B are to illustrate odd page read for reading data stored in memory cells which come into contact with odd-numbered channel layers CH. In particular, it was described above that reading may be separately performed on one side and the other side of each channel layer CH. FIG. 7A is a drawing for illustrating a read method for memory cells selected among memory cells which come into contact with the right sides of the odd-numbered channel layers CH, and FIG. 7B is a drawing for illustrating a read method for memory cells selected among memory cells which come into contact with the left sides of the odd-numbered channel layers CH. In the present embodiment, the selected memory cells are assumed to be memory cells connected to the first pair of word lines WL0 and WL0' and are shown by the dotted lines.

Referring to FIG. 7A, in order to perform odd page read, a voltage, for example, 1V, is applied to the odd-numbered channel layers CH through bit lines (not shown) connected to the corresponding channel layers CH, by which the odd-numbered channel layers CH are precharged. Conversely, 0 V is applied to the even-numbered channel layers CH.

Subsequently, in order to perform read of the memory cells (see the dotted lines) which are selected while coming into contact with the right sides of the odd-numbered channel layers CH, a read voltage Vread, for example, 0 V, is applied to the first word line WL0 of the first pair of word lines WL0 and WL0'. A pass voltage Vpass, for example, 4 to 5V, is applied to the word lines WL1 and WL2 of the memory cells which come into contact with the right sides of the odd-numbered channel layers CH and are not selected, so that these unselected memory cells are turned on. Conversely, all memory cells which come into contact with the left sides of the odd-numbered channel layers CH may be turned off during this operation. To this end, a turn-off voltage Voff, for example, 0 V, is applied to the second word lines WL0', WL1' and WL2'.

In this case, by sensing current flowing through the odd-numbered channel layers CH, the data stored in the selected memory cells which come into contact with the right sides of the odd-numbered channel layers CH and are connected to the first word line WL0 is read.

Referring to FIG. 7B, in order to perform odd page read, the voltage, for example, 1V, is applied to the odd-numbered channel layers CH through bit lines (not shown) connected to the corresponding channel layers CH, by which the odd-numbered channel layers CH are precharged. Conversely, 0 V is applied to the even-numbered channel layers CH.

Subsequently, in order to perform read of the memory cells (see the dotted lines) which are selected while coming into contact with the left sides of the odd-numbered channel layers CH, the read voltage Vread, for example, 0 V, is applied to the second word line WL0' of the first pair of word lines WL0 and WL0'. The pass voltage Vpass, for example, 4 to 5V, is applied to the word lines WL1' and WL2' of the memory cells which come into contact with the left sides of the odd-numbered channel layers CH and are not selected, so that these unselected memory cells are turned on. Conversely, all memory cells which come into contact with the right sides of the odd-numbered channel layers CH may be turned off during this operation. To this end, the turn-off voltage Voff, for example, 0 V, is applied to the first word lines WL0, WL1 and WL2.

In this case, by sensing current flowing through the odd-numbered channel layers CH, the data of the selected memory cells which come into contact with the left sides of the odd-numbered channel layers CH and are connected to the second word line WL0' is read.

Figure 7C:
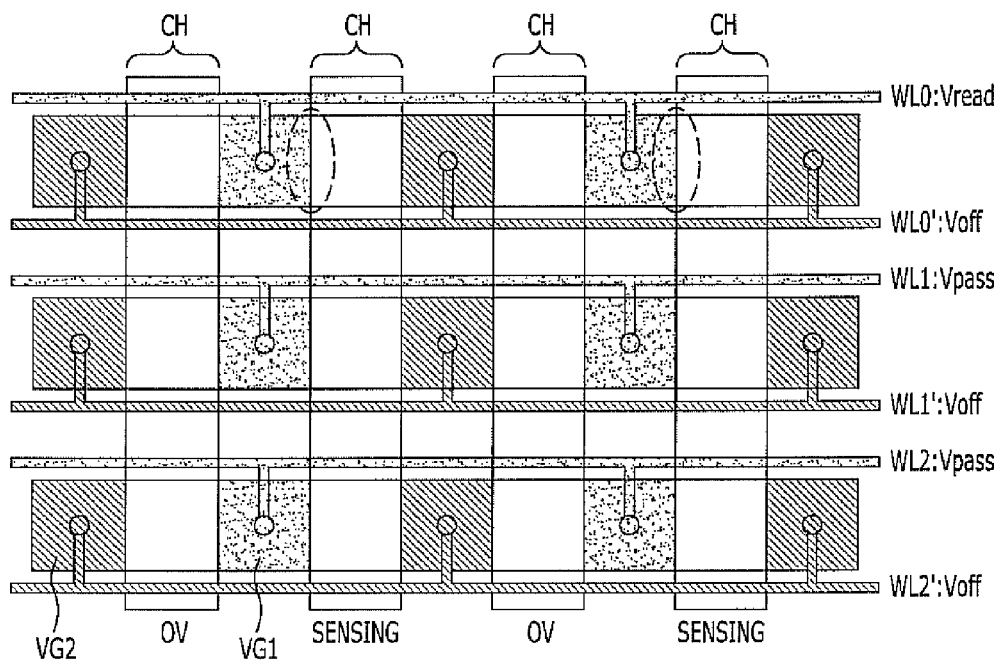
Figure 7D:
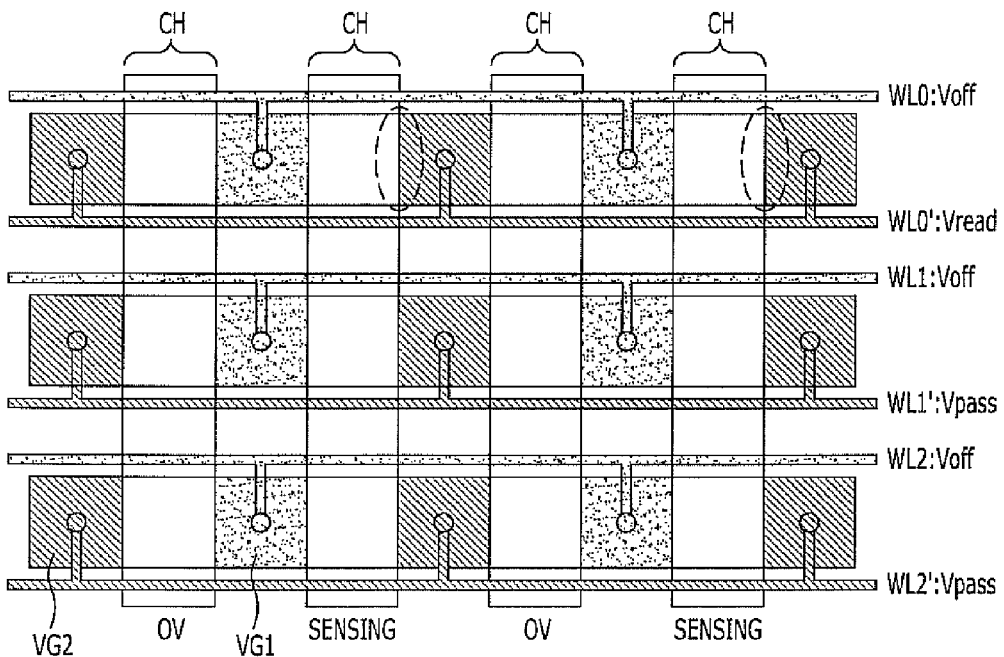

FIGS. 7C and 7D are to illustrate even page read for reading data stored in memory cells which come into contact with even-numbered channel layers CH. In particular, FIG. 7C is a drawing for illustrating a read method for memory cells selected among memory cells which come into contact with the left sides of the even-numbered channel layers CH, and FIG. 7D is a drawing for illustrating a read method for memory cells selected among memory cells which come into contact with the right sides of the even-numbered channel layers CH. In the present embodiment, the selected memory cells are assumed to be the memory cells which are connected to the first pair of word lines WL0 and WL0', and are shown by the dotted lines.

Referring to FIG. 7C, in order to perform even page read, a desired voltage, for example, 1V, is applied to the even-numbered channel layers CH through bit lines (not shown) connected to the corresponding channel layers CH, by which the even-numbered channel layers CH are precharged. Conversely, 0 V is applied to the odd-numbered channel layers CH.

Subsequently, in order to perform read of the memory cells (see the dotted lines) which are selected while coming into contact with the left sides of the even-numbered channel layers CH, a read voltage Vread is applied to the first word line WL0 of the first pair of word lines WL0 and WL0'. A pass voltage Vpass is applied to the word lines WL1 and WL2 of the memory cells which come into contact with the left sides of the even-numbered channel layers CH and are not selected. Conversely, all memory cells which come into contact with the right sides of the even-numbered channel layers CH may be turned off during this operation. To this end, a turn-off voltage Voff is applied to the second word lines WL0', WL1' and WL2'.

In this case, by sensing current flowing through the even-numbered channel layers CH, the data of the selected memory cells which come into contact with the left sides of the even-numbered channel layers CH and are connected to the first word line WL0 is read.

Referring to FIG. 7D, in order to perform even page read, the desired voltage, for example, 1V, is applied to the even-numbered channel layers CH through bit lines (not shown) connected to the corresponding channel layers CH, by which the even-numbered channel layers CH are precharged. Conversely, 0 V is applied to the odd-numbered channel layers CH.

Subsequently, in order to perform read of the memory cells (see the dotted lines) which are selected while coming into contact with the right sides of the even-numbered channel layers CH, the read voltage Vread is applied to the second word line WL0' of the first pair of word lines WL0 and WL0'. The pass voltage Vpass is applied to the word lines WL1' and WL2' of the memory cells which come into contact with the right sides of the even-numbered channel layers CH and are not selected. Conversely, all memory cells which come into contact with the left sides of the even-numbered channel layers CH may be turned off during this operation. To this end, the turn-off voltage Voff is applied to the first word lines WL0, WL1 and WL2.

In this case, by sensing current flowing through the even-numbered channel layers CH, the data of the selected memory cells which come into contact with the right sides of the odd-numbered channel layers CH and are connected to the second word line WL0' is read.

As a consequence, referring to FIGS. 7A to 7D, read of memory cells on one side of each channel layer CH and read of memory cells on the other side of the channel layer CH may be completely separately performed.

In the present embodiment, while the even page read and the odd page read are separately performed, it is to be noted that the present invention is not limited to such features. As described above, read may be performed by controlling the voltages applied to word lines. In this regard, 0 V is applied to the channel layers CH connected to bit lines as program inhibition targets, and the channel layers CH connected to bit lines as program targets are precharged.

As is apparent from the above description, according to the nonvolatile memory device and the method for fabricating the same according to the embodiments of the present invention, a multi-level cell in a three-dimensional structure is implemented.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
   a plurality of channel structures formed over a substrate and including a plurality of interlayer dielectric layers alternately stacked with a plurality of channel layers;
   first and second vertical gates alternately disposed between the channel structures along one direction crossing with the channel structure and adjoining the plurality of channel layers with a memory layer interposed therebetween; and
   a pair of first and second word lines disposed over or under the channel structures and extending along the one direction in such a way as to overlap with the first and second vertical gates,
   wherein the first word line is connected with the first vertical gates and the second word line is connected with the second vertical gates.

2. The nonvolatile memory device of claim 1, wherein the first and second word lines are disposed at different layers, respectively, over the channel structures.

3. The nonvolatile memory device of claim 1, wherein the first word line is disposed over the channel structures and the second word line is disposed under the channel structures.

4. The nonvolatile memory device of claim 3, wherein an end of the second word line projects beyond an end of the first word line.

5. The nonvolatile memory device of claim 1,
   wherein the first word line is connected with the first vertical gates through first contacts or directly with the first vertical gates while being insulated from the second vertical gates, and
   wherein the second word line is connected with the second vertical gates through second contacts or directly with the second vertical gates while being insulated from the first vertical gates.

6. The nonvolatile memory device of claim 1, wherein the first word line and the second word line each comprise a metal or a metal silicide.

7. The nonvolatile memory device of claim 1, wherein data stored in the memory layer that adjoins the first vertical gate on one side of one of the channel layers and data stored in the memory layer that adjoins the second vertical gate on the other side of the one channel layer are the same or different from each other.

8. The nonvolatile memory device of claim 1,
   wherein the first and second word lines overlap with each of the first and second vertical gates.

9. A method for programming the nonvolatile memory device of claim 1, comprising:
   performing a first program action of, in order to introduce charges into the memory layer which adjoins the first vertical gate of a first column on one side of a first channel layer among the plurality of channel layers, applying a program voltage to the first word line that overlaps with the first column and applying a turn-off voltage to the second word line that overlaps with the first column; and
   performing a second program action of, in order to introduce charges into the memory layer that adjoins the second vertical gate of the first column on the other side of the first channel layer, applying a program voltage to the second word line that overlaps with the first column and applying a turn-off voltage to the first word line that overlaps with the first column.

10. The method of claim 9,
   wherein, in the performing of the first program action, a pass voltage and a turn-off voltage are respectively applied to the first word line and the second word line that overlap with remaining columns excluding the first column, and
   wherein, in the performing of the second program action, a turn-off voltage and a pass voltage are respectively applied to the first word line and the second word line that overlap with the remaining columns.

11. The method of claim 9, wherein, in the performing of the first and second program actions, 0 V is applied to the first channel layer and remaining channel layers are in a boosted state.

12. A method for reading the nonvolatile memory device of claim 1, comprising:
   performing a first read action of, in order to read data stored in the memory layer that adjoins the first vertical gate of a first column on one side of a first channel layer among the plurality of channel layers, applying a read voltage to the first word line that overlaps with the first column and applying a turn-off voltage to the second word line that overlaps with the first column; and
   performing a second read action of, in order to read data stored in the memory layer that adjoins the second vertical gate of the first column on the other side of the first channel layer, applying a read voltage to the second word line that overlaps with the first column and applying a turn-off voltage to the first word line that overlaps with the first column.

13. The method of claim 12,
   wherein, in the performing of the first read action, a pass voltage and a turn-off voltage are respectively applied to the first word line and the second word line that overlap with remaining columns excluding the first column, and
   wherein, in the performing of the second read action, a turn-off voltage and a pass voltage are respectively applied to the first word line and the second word line that overlap with the remaining columns excluding the first column.

14. The method of claim 12, wherein, in the performing of the first and second read actions, the first channel layer is in a precharged state, and 0 V is applied to remaining channel layers.

* * * * *